(12) United States Patent
Tonegawa

(10) Patent No.: US 11,081,454 B2
(45) Date of Patent: Aug. 3, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventor: Takashi Tonegawa, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/687,228

(22) Filed: Nov. 18, 2019

(65) Prior Publication Data

US 2020/0203496 A1 Jun. 25, 2020

(30) Foreign Application Priority Data

Dec. 21, 2018 (JP) .............................. JP2018-239507

(51) Int. Cl.
*H01L 23/00* (2006.01)
*H01L 29/45* (2006.01)
*H01L 21/288* (2006.01)
*H01L 21/768* (2006.01)
*H01L 23/532* (2006.01)

(52) U.S. Cl.
CPC ............ *H01L 24/03* (2013.01); *H01L 21/288* (2013.01); *H01L 21/76867* (2013.01); *H01L 23/53266* (2013.01); *H01L 24/05* (2013.01); *H01L 29/456* (2013.01)

(58) Field of Classification Search
None
See application file for complete search history.

(56) References Cited

U.S. PATENT DOCUMENTS

| 2002/0121709 | A1* | 9/2002 | Matsuki | H01L 23/49811 |
| | | | | 257/786 |
| 2010/0258335 | A1* | 10/2010 | Arvin | C25D 5/14 |
| | | | | 174/126.2 |
| 2015/0069613 | A1 | 3/2015 | Shiraishi et al. | |
| 2019/0122890 | A1* | 4/2019 | Thorkelsson | H01L 24/11 |

FOREIGN PATENT DOCUMENTS

| JP | 2001060760 | A | * | 3/2001 | |
| JP | 2007227783 | A | * | 9/2007 | ............ H01L 24/48 |
| JP | 2015-056532 | A | | 3/2015 | |

* cited by examiner

*Primary Examiner* — Andres Munoz
(74) *Attorney, Agent, or Firm* — McDermott Will & Emery LLP

(57) ABSTRACT

Reliability of a semiconductor device having a plated layer formed on an electrode pad is improved. The method of manufacturing the semiconductor device includes a step for forming the plated layer on the electrode pad by moving the semiconductor wafer at a second speed, in a nickel-plating solution, after moving the semiconductor wafer at a first speed higher than the second speed. After moving the semiconductor wafer at the first speed, the semiconductor wafer is moved at the second speed without bringing the semiconductor wafer out from the nickel-plating solution.

12 Claims, 26 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2018-239507 filed on Dec. 21, 2018 including the specification, drawings and abstract is incorporated herein by reference in its entirety.

BACKGROUND

The present disclosure relates to, for example, a semiconductor device having plated layers formed on electrode pads and a manufacturing method thereof.

A semiconductor device having an electrode pad and a nickel-plated layer formed on the electrode pad is known. The nickel plated layer described in Patent Document 1 contains phosphorus atoms derived from a reducing agent for a plating reaction. The nickel plated layer has a low concentration plated layer and a high concentration plated layer formed on the low concentration plated layer. The concentration of phosphorus atoms included in the low concentration plated layer is smaller than the concentration of phosphorus atoms included in the high concentration plated layer.

The nickel plated layer is formed by an electroless plating method. Specifically, first, a low concentration plating solution having a relatively small concentration of phosphorus atoms, a high concentration plating solution having a relatively large concentration of phosphorus atoms, and washing water are prepared. The low concentration plated layer is formed by immersing the semiconductor wafer on which the electrode pad is formed in a low concentration plating solution. Next, the semiconductor wafer is taken out of the low concentration plating solution, washed with cleaning water, and then immersed in the high concentration plating solution, whereby the high concentration plated layer can be formed on the low concentration plated layer. In the semiconductor device described in Patent Document 1, the occurrence of cracks in the nickel-plated layer is suppressed by the relatively soft low-concentration plated layer, and the wettability of the solder with respect to the plated layer can be enhanced by the relatively hard high-concentration plated layer.

SUMMARY

However, after the low concentration plated layer is formed on the electrode pad, the electrode pad is removed from the low concentration plating solution and exposed to the atmosphere before the high concentration plated layer is formed. For this reason, in the semiconductor device described in Document 1, an oxide layer is formed at the interface between the low concentration plated layer and the high concentration plated layer, and mismatch occurs between the low concentration plated layer and the high concentration plated layer at atomic levels. As a result, the high concentration plated layer may delaminate from the low concentration plated layer. That is, in the semiconductor device described in Patent Document 1, there is room for improvement from the viewpoint of improvement in reliability of semiconductor device.

It is an object of the embodiment to improve the reliability of the semiconductor device. Other objects and novel features will become apparent from the description of the specification and drawings.

The manufacturing method of the semiconductor device according to one embodiment is a method of manufacturing a semiconductor device including a step for forming a plated layer on an electrode pad by an electroless plating method. The method includes the step for preparing a semiconductor wafer having a semiconductor substrate, an insulating layer formed on the semiconductor substrate, and the electrode pad formed on the insulating layer. And, the method includes the step for forming the plated layer on the electrode pad by moving the semiconductor wafer at a second speed, in a nickel-plating solution, after moving the semiconductor wafer at a first speed higher than the second speed. Further, after moving the semiconductor wafer at the first speed, the semiconductor wafer is moved at the second speed without bringing the semiconductor wafer out from the nickel-plating solution.

The semiconductor device according to the embodiment includes a semiconductor substrate, an insulating layer, an electrode pad, a first plated layer, a first intermediate layer, and a second plated layer. The concentration of atom included in the first intermediate layer is gradually increased from the first plated layer toward the second plated layer, the atom included in the first intermediate layer being one of phosphorus atom and boron atom.

According to the embodiment, the reliability of the semiconductor device can be improved.

DETAILED DESCRIPTION

Figure 1:
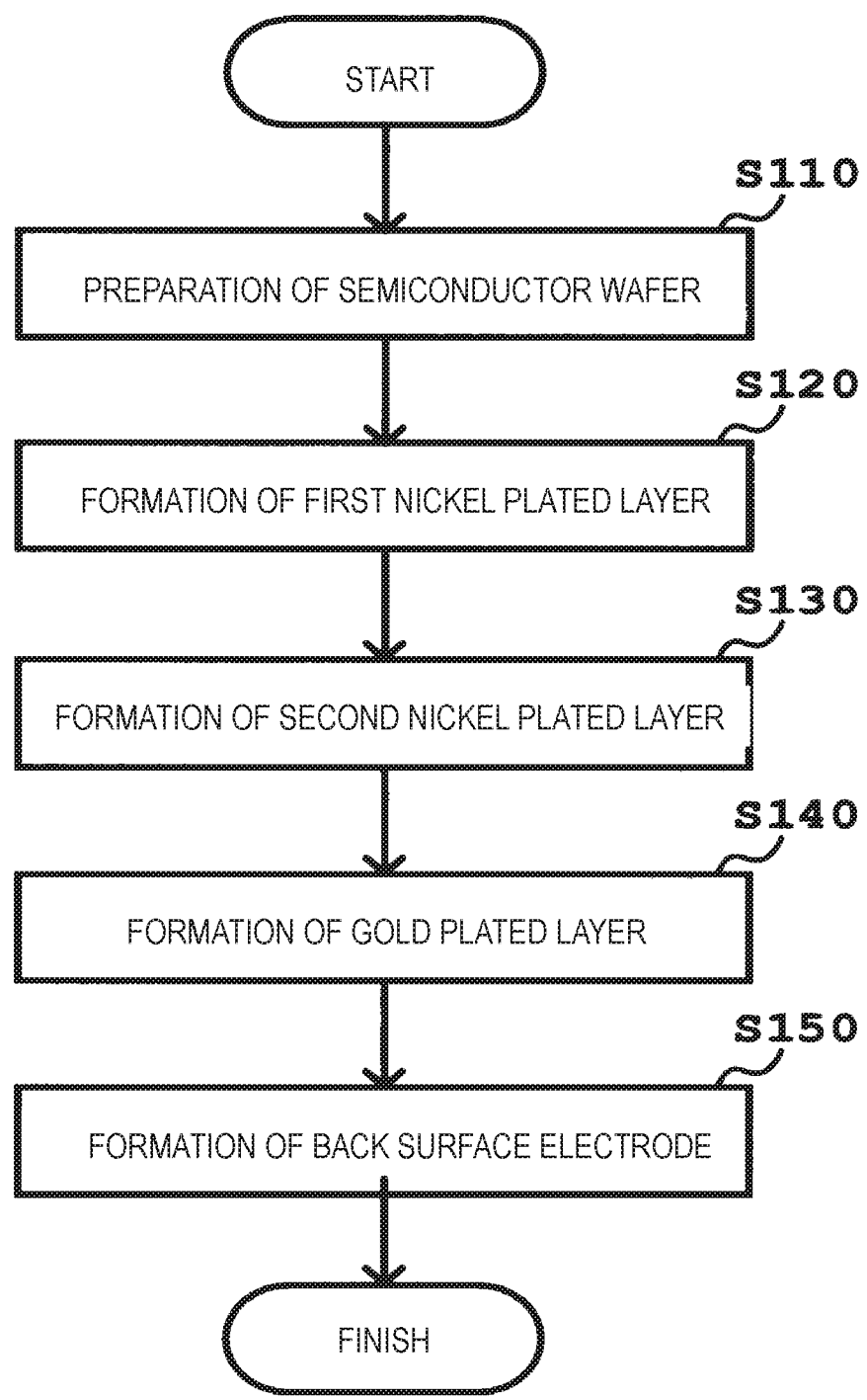
FIG. 1 is a flow chart showing an exemplary process included in the manufacturing method of the semiconductor device according to the first embodiment.

Hereinafter, a semiconductor device and its manufacturing method according to an embodiment will be described in detail by referring to the drawings. In the specification and the drawings, the same or corresponding components are denoted by the same reference numerals, and a repetitive description thereof is omitted. In the drawings, for convenience of description, the configuration may be omitted or simplified. Also, at least some of the embodiments may be arbitrarily combined with each other.

First Embodiment

The semiconductor device SD1 according to first embodiment has a two-layered nickel plated layer composed of a first nickel plated layer NiPL1 and a second nickel plated layer NiPL2. Bonding clips BCs are electrically connected to the nickel-plated layers of the first embodiment.

(Method of Manufacturing Semiconductor Device)

Figure 2:
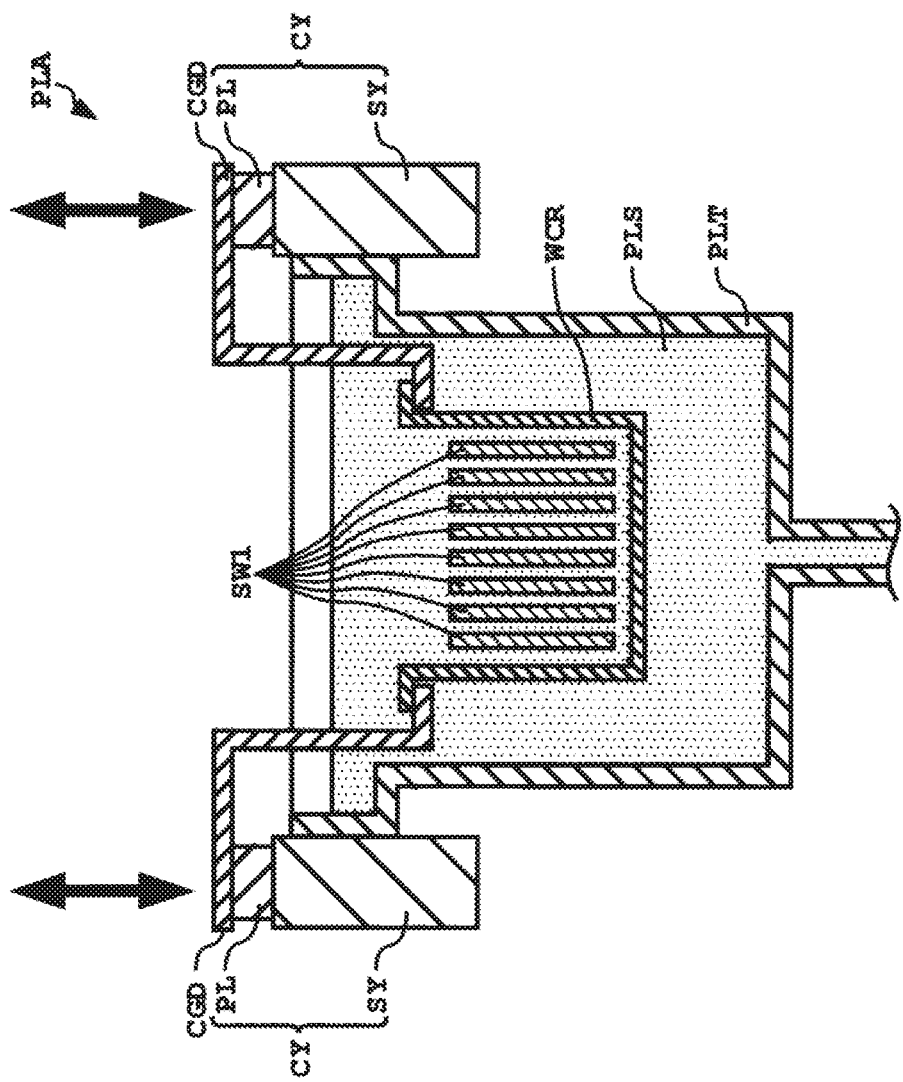
FIG. 2 is a cross-sectional view showing an exemplary configuration of a plating device for forming nickel-plated layers of semiconductor device according to first embodiment.

FIG. 1 is a flow chart showing an exemplary process included in the manufacturing method of the semiconductor device SD1 according to the first embodiment. FIG. 2 is a cross-sectional view showing an exemplary configuration of a plating device PLA for forming nickel-plated layers of semiconductor device SD1 according to first embodiment. FIGS. 3 to 7 are main portion cross-sectional view showing examples of the steps included in the manufacturing method of the semiconductor device SD1.

As shown in FIG. 1, the manufacturing method of the semiconductor device SD1 includes a preparation process (S110) of the semiconductor wafer SW1, a formation process (S120) of the first nickel plated layer NiPL1, a formation process (S130) of the second nickel plated layer NiPL2, a formation process (S140) of the gold plated layer AuPL, and a formation process (S150) of the back surface electrode BE. In first embodiment, in the first nickel plated layer NiPL1 forming step (S120) and the second nickel plated layer NiPL2 forming step (S130), the plating reactions are continuously performed without removing the semiconductor wafer SW1 from the plating solution PLS.

(Step for Preparing Semiconductor Wafer SW1)

Figure 3:
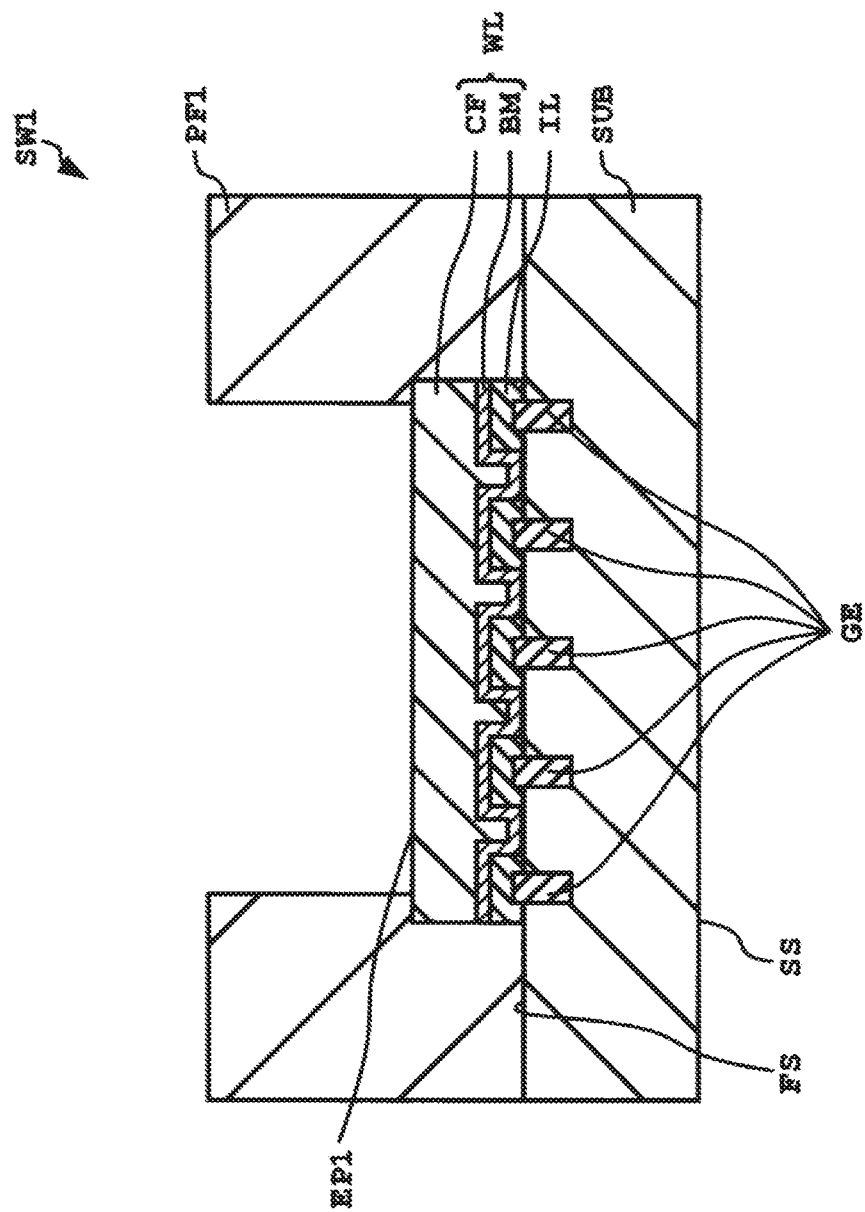
FIG. 3 is a main portion cross-sectional view showing an exemplary process included in the manufacturing method of the semiconductor device according to the first embodiment.

First, as shown in FIGS. 2 and 3, a semiconductor wafer SW1 is prepared (S110). The semiconductor wafer SW1 according to the first embodiment includes a semiconductor substrate SUB, an insulating layer IL, a wiring layer WL, and a protective film PF1. A portion of the wiring layers WL exposed from the protective film PF1 comprises the electrode pad EP1. As shown in FIG. 2, the prepared semiconductor wafer SW1 is placed on a wafer carrier WCR for the semiconductor wafer WCR. There is no particular limitation on the number of the prepared semiconductor wafers SW1. In first embodiment, eight wafers SW1 are prepared, as shown in FIG. 2.

The semiconductor wafer SW1 is obtained by, for example, forming the insulating layer IL, the wiring layer WL, and the protective film PF1 on the semiconductor substrate SUB in this order.

The size (diameter) of the semiconductor wafer SW1 is not particularly limited. For example, examples of diameters of a semiconducting wafer SW1 include 150 mm, 200 mm, 300 mm, and 450 mm. In first embodiment, the diameters of the semiconductor wafer SW1 are 200 millimeters.

A semiconductor element is formed on the semiconductor wafer SW1. Examples of such devices include so-called vertical MOSFET, IGBT (Insulated Gate Bipolar Transistor) and FRD (Fast Recovery Diode). Here, the vertical MOSFET is a MOSFET in which channels are formed in the thickness direction of the semiconductor substrate SUB. As a method of forming the semiconductor device, a well-known method for forming a vertical MOSFET can be appropriately selected.

The semiconductor substrate SUB has a first surface FS and a second surface SS that are both front and back relative to each other. In the first embodiment, the source region and the gate electrode GE are formed on the first surface FS of the semiconductor substrate SUB, and the drain region is formed on the second surface SS of the semiconductor substrate SUB. An example of the semiconductor substrate SUB includes silicon (Si) substrate, silicon carbide (SiC) substrate, gallium nitride (GaN) substrate, and gallium oxide (Ga2O) substrate. In first embodiment, the semiconductor substrate SUB is silicone substrate. For example, the thickness of the semiconductor substrate SUB is equal to or greater than 600 μm, and equal to or less than 800 μms.

Next, insulating layers ILs are formed on the semiconductor substrate SUB. Openings are formed in the insulating layer IL to expose the source regions of the semiconductor substrate SUB. Specifically, for example, after the insulating film IL is formed on the semiconductor substrate SUB by the Chemical Vapor Deposition method, an opening is formed in the insulating film IL at a position corresponding to the source area of the semiconductor substrate SUB. The opening may be formed by known photolithography and etching techniques. An example of the material comprising the insulating layer IL includes silicon oxide (SiO2).

Next, a wiring layer WL is formed on the insulating layer IL. In first embodiment, a wiring layer WL composed of the barrier film BM and the conductive film CF formed on the barrier film BM is formed on the insulating layer IL so as to cover the gate electrodes GE. First, a barrier film BM is formed on the inner surface (bottom surface and side surface) of the opening and on the insulating layer IL by, e.g., CVD. An example of the material comprising the barrier film BM includes titanium tungsten (TiW), titanium nitride (TiN), titanium (Ti), and a stacked film (TiN/Ti) of titanium nitride (upper layer) and titanium (lower layer).

Next, after a conductive film CF is formed on the barrier film BM by, e.g., a sputtering method, the conductive film CF is processed into a desired pattern by a known photolithography technique and etching technique. An example of the material comprising the conductive film CF includes aluminum and an aluminum alloy. An example of such aluminum alloys includes aluminum-silicon alloys (AlSi), aluminum-copper alloys (AlCu) and aluminum-silicon-copper alloys (AlSiCu).

Next, a protective film PF1 having a pad opening exposing a part of the wiring layer WL is formed on the insulating layer IL. First, for example, a coating solution containing precursors of materials comprising the protective film PF1 is applied onto the insulating layer IL and the wiring layer WL by a spin-coating method to form a coating film. Next, the coating film is cured to form a protective film PF1 on the insulating layer IL and the wiring layer WL. An example of the material comprising the protective film PF1 includes polyimides. Next, a pad opening for exposing a part of the interconnect layer WL is formed in the protective film PF1. The pad opening may be formed by removing a portion of the protective film PF1 by known photolithography and etch techniques. Note that portions of the interconnect layers WLs exposed to the inside of the pad openings EP1 the electrode pads and function as the electrode pads.

The electrode pad EP1 may be subjected to a pretreatment as required. For example, the electrode pad EP1 may be plasma-treated with an inert gas such as argon (Ar) to remove the native oxide film on the electrode pad EP1. The SW1 of the semiconductor wafer may then be immersed in an alkaline aqueous solution to remove fat, foreign matter and oxide layers on the surfaces of the electrode pads EP1. In addition, the semiconductor wafer SW1 may be immersed in an acidic aqueous solution to remove metallic foreign matter on the surfaces of the electrode pads EP1. The electrode pad EP1 may be zincated to form a zinc layer on the surface of the electrode pad EP1.

(Step for Forming First Nickel Plated Layer NiPL1)

Figure 4:
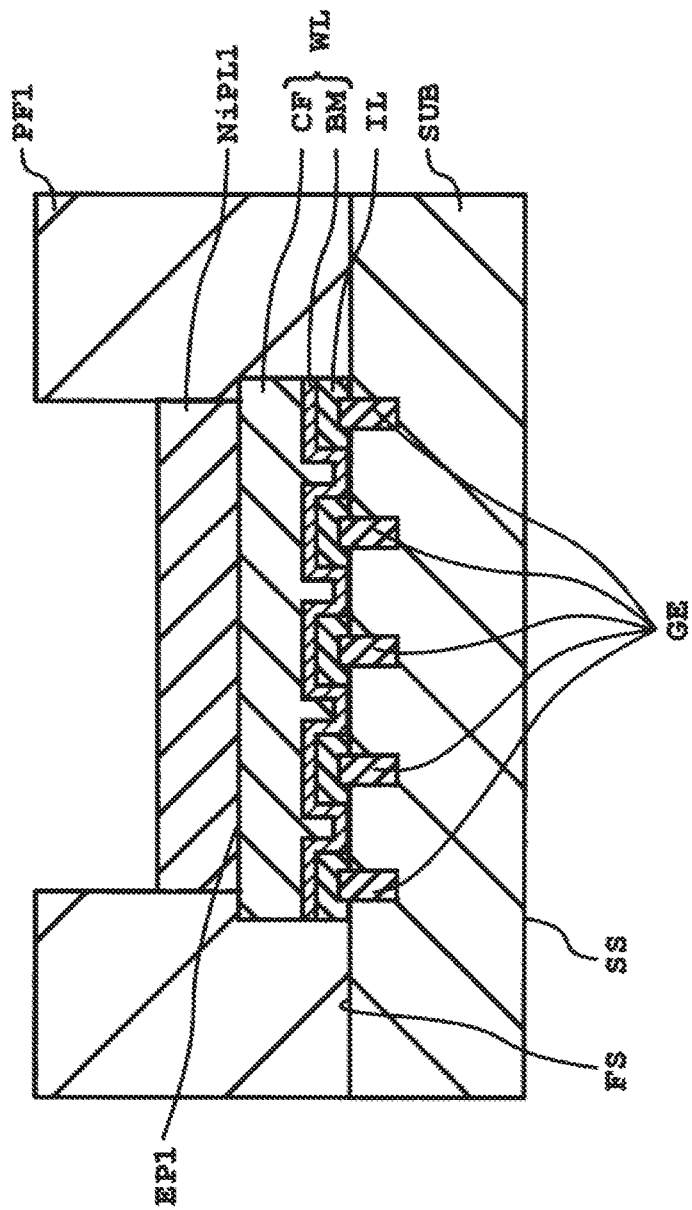
FIG. 4 is a main portion cross-sectional view showing an exemplary process included in the manufacturing method of the semiconductor device according to the first embodiment.

Next, as shown in FIG. 4, a first nickel plated layer NiPL1 is formed on the electrode pad EP1 (S120). Specifically, first, a plating solution PLS for nickel plating shown in FIG. 2 is prepared. The content component of the plating solution PLS can be appropriately selected from materials known as the content component of the plating solution for nickel plating. The plating solution PLS is an aqueous solution containing at least a nickel salt and a reducing agent.

The nickel salt is a compound serving as a source of nickel ions in the plating reaction. The nickel salt may be appropriately selected from materials known as nickel salt for electroless plating. An example of the above nickel salts includes nickel sulfate and nickel chloride. A concentration of the above nickel salts is, for example, equal to or greater than 5.0 g/L, and equal to or less than 6.5 g/L.

The reducing agent is a compound that reduces nickel ions to metallic nickel in a plating reaction. The reducing agent is, for example, a phosphorus compound containing a phosphorus atom. The reducing agent may be appropriately selected from materials known as reducing agents for electroless plating. An example of the reducing agent include hypophosphite ($H_3PO_2$) and hypophosphites such as sodium hypophosphite ($NaH_2PO_2$2), potassium hypophosphite ($KH_2PO_2$), and ammonium hypophosphite ($NH_4 \cdot H_2PO_2$). The concentration of the reducing agent is, for example, equal to or greater than 10 g/L, and equal to or less than 50 g/L.

The plating solution PLS may further contain other components as necessary. Examples of such other components include, for example, complexing agents, accelerators, and stabilizers. An example of such complexing agents includes oxycarboxylic acids such as citric acid, malic acid, and lactic acid, and amino acids such as glycine and alanine. An example of such promoters includes acetic acid, succinic acid and malonic acid. An example of such stabilizers includes heavy metal salts such as lead compounds and sulfur compounds. An example of the wetting agent includes a surfactant. An example of such additives includes heavy metal salts and organic compounds.

The plating conditions such as the temperature, pH, flow rate, and plating time of the plating solution PLS may be appropriately adjusted as necessary. The temperature of the plating solution PLS is, for example, equal to or higher than 80 degree, and equal to or lower than 90 degree. The pH of the plating solution PLS is, for example, equal to or greater than 4, and equal to or less than 5. The flow rate of the plating solution PLS is, for example, equal to or higher than 5 L/min., and equal to or lower than 18 L/min. For example, the plating time is 3 minutes or more and 30 minutes or less.

Next, as shown in FIG. 2, the prepared plating solution PLS is accommodated in the plating bath PLT in the plating device PLA. Next, the semiconductor wafer SW1 placed on the wafer carrier WCR is immersed in the plating solution PLS. For example, the wafer carrier WCR may be installed in the carrier guides CGD of the plating device PLAs.

Next, in the plating solution PLS, the semiconductor wafer SW1 is moved at a first speed to form a first nickel-plated layer NiPL1 on the electrode pad EP1. The method of moving the semiconductor wafer SW1 is not particularly limited. For example, the carry guide CGD supporting the wafer carrier WCR may be moved by the moving means. An example of such moving means includes cylinders, motors and cam mechanisms. In first embodiment, the moving device is a cylinder CY comprised of a syringe SY and a plunger PL. An example of cylinders CY includes pneumatic cylinders and hydraulic cylinders.

The first speed may be appropriately adjusted in accordance with the first concentration of phosphorus atoms contained in the first nickel-plated layer NiPL1. For example, when the semiconductor wafer SW1 is reciprocated, the first frequency is equal to or higher than 1 Hz. On the other hand, if the first speed is too high, a precipitation failure of nickel tends to occur. For example, the first speed is preferably 2 Hz or less.

In first embodiment, the cylinder CY is controlled to reciprocate the semiconductor wafer SW1 in the plating solution PLS along the main surface (first surface FS) of the semiconductor wafer SW1. The moving direction of the semiconductor wafer SW1 may be a vertical direction (the depth direction of the plating solution PLS), a horizontal direction (the in-plane direction of the free liquid surface of the plating solution PLS), or an oblique direction (the combined direction of the vertical direction and the horizontal direction).

The moving range (amplitude) of the semiconductor wafer SW1 when the semiconductor wafer SW1 is reciprocated can be appropriately set in accordance with conditions such as the degree of circulation of the plating solution PLS, the size of the plating bath PLT, the size of the semiconductor wafer SW1, and the like. Here, the moving range (amplitude) mean the respective distances (corresponding to the length of the double-headed arrows in FIG. 2) of the forward path and the double-headed path when the semiconductor wafer SW1 reciprocates. For example, if the moving range of the semiconductor wafer SW1 is too small, the circulation of the plating solution PLS in the plating tank PLT becomes insufficient, and the effect of moving the semiconductor wafer SW1 tends not to be sufficiently obtained. On the other hand, if the moving range of the semiconductor wafer SW1 is too large, a large amount of the plating solution PLS or a large-sized plating tank PLT is required, which tends to increase the manufacturing costs. For example, it is preferable that the moving range is not less than a length corresponding to 10% of the diameter of the semiconductor wafer SW1 and not more than a length corresponding to 20% of the diameter of the semiconductor wafer SW. For example, the moving range is preferably equal to or greater than 2 cm, and equal to or less than 4 cm. In first embodiment, the moving range of the semiconductor wafer SW1 is about 3 cm.

(Step for Forming Second Nickel Plated Layer NiPL2)

Figure 5:
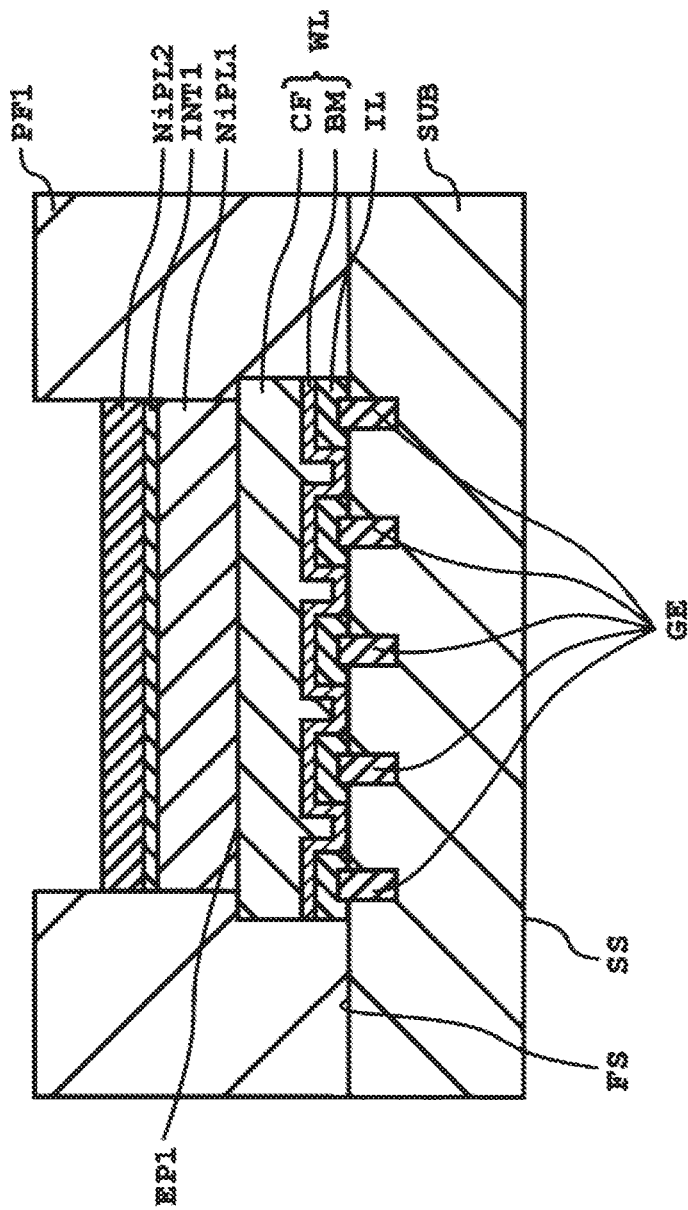
FIG. 5 is a main portion cross-sectional view showing an exemplary process included in the manufacturing method of the semiconductor device according to the first embodiment.

And then, as shown in FIG. 5, a second nickel plated layer NiPL2 is formed on the first nickel plated layer NiPL1 via a first intermediate layer INT1 (process S130). Specifically, the moving speed of the semiconductor wafer SW1 in the plating solution PLS may be switched from the first speed to the second speed by adjusting the operation of the cylinder CY shown in FIG. 2. At this time, the switching from the first speed to the second speed is continuously performed without bringing the semiconductor wafer SW1 out from the plating solution. As a result, the second nickel plated layer NiPL2 can be formed on the first nickel plated layer NiPL1 without oxidizing the surface of the first nickel plated layer NiPL1.

The second speed is less than the first speed. Like the first speed, the second speed can be appropriately adjusted in accordance with the second concentrations of phosphorus atoms contained in the second nickel-plated-layer NiPL2. For example, the second speed (frequency) is preferably equal to or higher than 0 Hz, and equal to or less than 1 Hz. In first embodiment, the second rate is greater than 0 Hz and less than 1 Hz. On the other hand, if the second speed is too small, the circulation of the plating solution PLS on the surface of the semiconductor wafer SW1 becomes inadequate, and the plating reaction tends not to proceed properly. This may cause abnormal growth of the plated layer, resulting in abnormal appearance of the second nickel-plated layer NiPL2. For example, it is more preferable that the second speed (frequency) is equal to or higher than 0.3 Hz.

Note that the first intermediate layer INT1 is a nickel plated layer formed on the first nickel plated layer NiPL1 during a period until the moving speed of the semiconductor wafer SW1 is switched from the first speed to the second speed. The concentration of phosphorus atoms contained in the first interlayer INT1 continuously increases from the first concentration to the second concentration.

As described above, the formation step (S120) of the second nickel plated layer NiPL2 is continuously performed after the formation step (S110) of the first nickel plated layer NiPL1 without bringing the semiconductor wafer SW1 out from the plating solution PLS. Therefore, an oxide layer of the first nickel plated layer NiPL1 is not formed between the first nickel plated layer NiPL1 and the second nickel plated layer NiPL2. Note that the step of forming the second nickel plated layer NiPL2 can be performed under substantially the same condition as the step of forming the first nickel plated layer NiPL1 except for the moving speed of the semiconductor wafer SW1. If required, after the second nickel-plated layers NiPL2 are formed, the SW1 of the semiconductor wafer may be cleaned with pure water.

(Step for Forming Gold Plated Layer AuPL)

Figure 6:
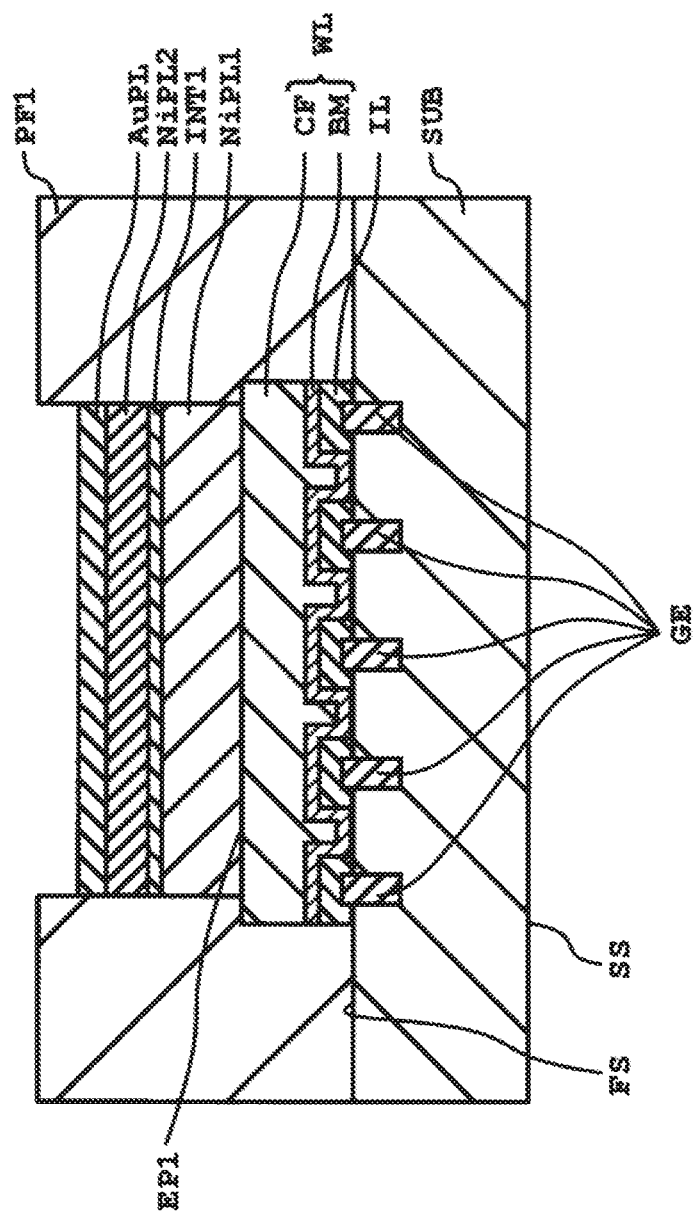
FIG. 6 is a main portion cross-sectional view showing an exemplary process included in the manufacturing method of the semiconductor device according to the first embodiment.

Next, as shown in FIG. 6, a gold plated layer AuPL is formed on the second nickel plated layer NiPL2 (S140). Specifically, first, a plating solution for gold plating is prepared. The component contained in the plating solution can be appropriately selected from materials known as the component contained in the plating solution for gold plating. The plating solution is an aqueous solution containing, for example, sodium sulfite and/or potassium cyanide. Further, in the process of forming the gold plated layer AuPL, only the substitution gold plating reaction may be performed, or the substitution gold plating reaction and the reduction gold plating reaction may be performed, depending on the desired thickness of the gold plated layer AuPL. The plating solution is accommodated in a plating bath in a plating device for electroless plating.

Next, the gold plated layer AuPL may be formed on the second nickel plated layer NiPL2 in the same manner as the first nickel plated layer NiPL1 except that the plating solution differs. In the step of forming the gold plated layers, the semiconductor wafer SW1 may or may not be moved. If required, after the gold plated layers AuPL are formed, the SW1 of the semiconductor wafer may be cleaned with pure water.

(Step for Forming Back Electrode BE)

Figure 7:
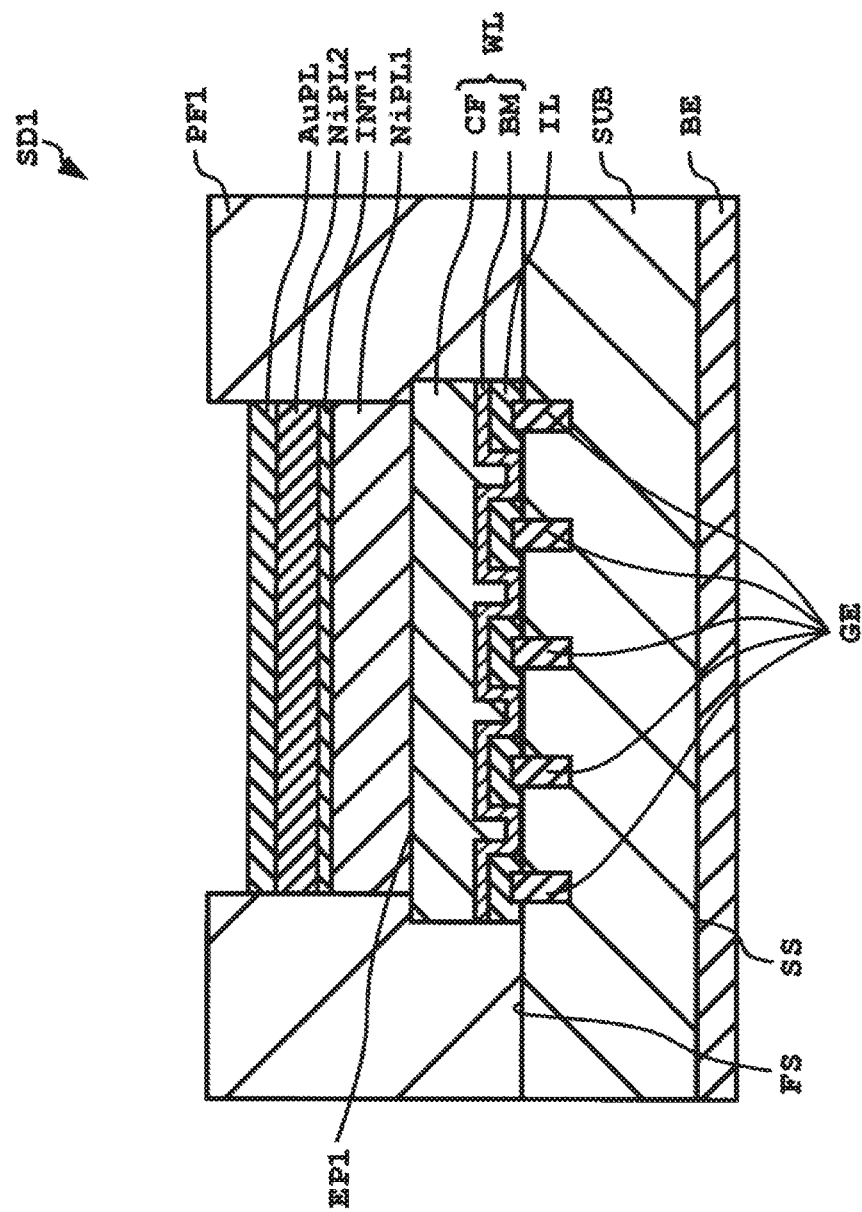
FIG. 7 is a main portion cross-sectional view showing an exemplary process included in the manufacturing method of the semiconductor device according to the first embodiment.

Next, as shown in FIG. 7, the back surface electrode BE is formed on the back surface (second surface SS) of the semiconductor wafer SW1 (S150). The method of forming the back surface electrode BE is not particularly limited, and may be appropriately selected from known methods. For example, the back surface electrode BE may be formed by forming a titanium (Ti) layer, a nickel (Ni) layer, a silver (Ag) layer, and a gold (Au) layer in this order by a CVD method or a sputtering method.

Prior to the step of forming the back surface electrode BE, the second surface SS of the semiconductor wafer SW1 may be ground in advance so that the thickness of the semiconductor wafer SW1 becomes a desired thickness.

Finally, by dicing the semiconductor wafer SW1, a plurality of singulated semiconductor device SDs 1 are obtained.

By the above manufacturing method, the semiconductor device SD1 related to first embodiment can be manufactured.

(Relationship between Moving Speed of Semiconductor Wafer and Concentration of Phosphorus of Nickel Plated Layer)

Experiments were conducted to investigate the relationship between the moving speed of the semiconductor wafer SW1 and the phosphorus concentration of the nickel plated layer. For reference, the relationship between the moving speed of the semiconductor wafer SW1 and the deposition speed of the nickel-plated layer was also examined. In this experiment, the deposition rate of the nickel plated layer and the phosphorus concentration of the nickel plated layer were measured when the semiconductor wafer SW1 (diameter: 200 mm) was reciprocated at a plurality of moving speeds differing from each other in the plating solution PLS. As the plating solution PLS, a plating solution prepared so that the concentration of nickel sulfate was 6 g/L and the concentration of hypophosphorous acid was 30 g/L was used.

The deposition rate of the nickel plated layer was calculated from the thickness and deposition time after measuring the thickness of the nickel plated layer based on the intensity of peaks caused by nickel atoms by measuring the fluorescence X-ray spectrum of the nickel plated layer using a fluorescence X-ray measuring instrument (manufactured by Fisher Instruments, Inc., FISCHERSCOPE X-RAY XDV-pWAFER). "FISCHERSCOPE" and "XDV" are registered trademarks of Fisher Instruments Corporation.

The phosphorus concentration of the nickel plated layer was measured on the basis of the intensity of the peak attributable to the nickel atom of the nickel plated layer by measuring the fluorescence X-ray spectrum of the nickel plated layer as described above.

Figure 8A:
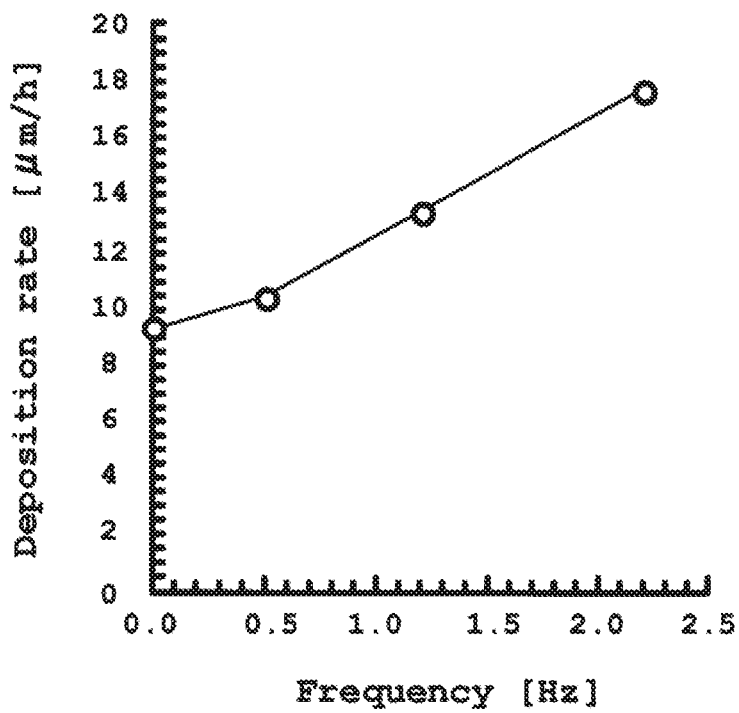
FIG. 8A is a graph showing the relationship between the moving speed of the semiconductor wafer and the deposition speed of the nickel plated layer.
Figure 8B:
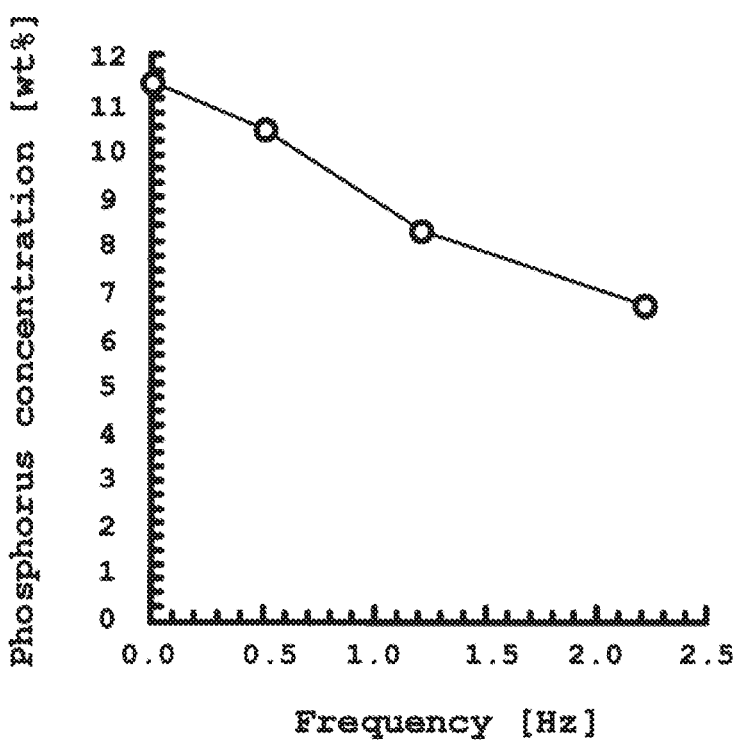
FIG. 8B is a graph showing the relationship between the moving speed of the semiconductor wafer and the phosphorus concentration of the nickel plated layer.

FIG. 8A is a graph showing the relationship between the moving speed of the semiconductor wafer SW1 and the deposition speed of the nickel plated layer, and FIG. 8B is a graph showing the relationship between the moving speed of the semiconductor wafer SW1 and the phosphorus concentration of the nickel plated layer. In FIG. 8A, the horizontal axis represents the frequency [Hz] indicating the moving speed of the SW1 of the semiconductor wafer, and the vertical axis represents the deposition speed [μm/h] of the nickel-plated layer. In FIG. 8B, the horizontal axis represents the frequency [Hz] indicating the moving speed of the SW1 of the wafer, and the vertical axis represents the phosphorus concentration [wt %] of the nickel-plated layer.

As shown in the drawing 8A, it was found that the higher the frequency indicating the moving speed of the SW1 of the wafer, the higher the deposition speed of the nickel-plated layer. For example, when the frequency is 0.3 Hz, the deposition rate of the nickel plated layer is 10 μm/h, whereas when the frequency is 2 Hz, the deposition rate of the nickel plated layer is 17 μm/h.

On the other hand, as shown in the drawing 8B, it was found that the phosphorus concentrations of the nickel-plated layers became smaller as the frequency indicating the moving speed of the SW1 of the semiconductor wafer became higher. For example, when the frequency is 0.3 Hz, the phosphorus concentration of the nickel plated layer is 11 wt %, whereas when the frequency is 2 Hz, the phosphorus concentration of the nickel plated layer is 7 wt %.

From the results of the present experiments, it is estimated that the higher the moving speed of the semiconductor wafer SW1, the higher the deposition speed of the nickel-plated layer due to the accelerated plating reactions. Further, it is presumed that the amount of phosphorus atoms taken in the nickel plated layer is decreased by increasing the deposition rate of the nickel plated layer, and as a result, the phosphorus concentration of the nickel plated layer is decreased. As described above, it has been found that the phosphorus concentrations of the nickel-plated layers can be controlled in accordance with the moving speed of the semiconductor wafer SW1.

(Configuration of Semiconductor Device)

Figure 9:
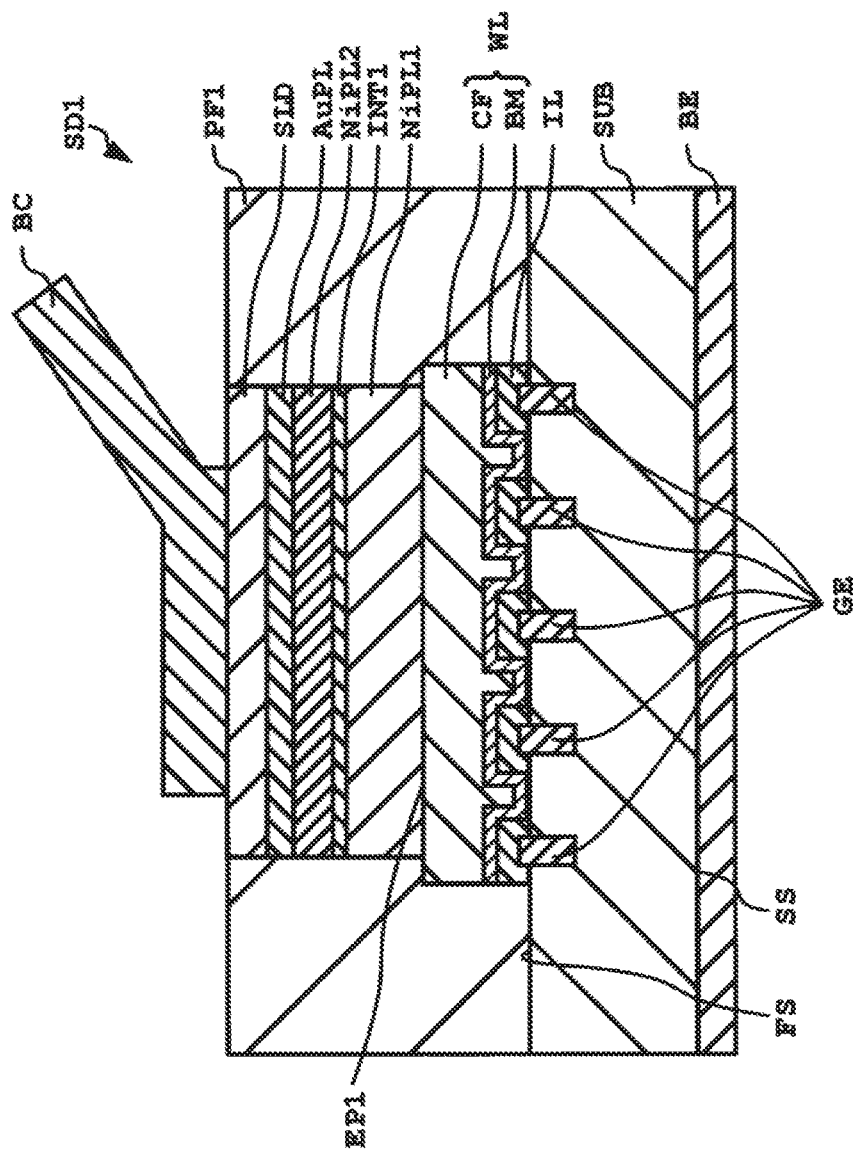
FIG. 9 is a main portion cross-sectional view showing an exemplary configuration of a semiconductor device according to the first embodiment.

Next, the configuration of the semiconductor device SD1 according to the first embodiment will be described. FIG. 9 is a main portion cross-sectional view illustrating an exemplary configuration of the semiconductor device SD 1 according to the first embodiment.

As shown in FIG. 9, the semiconductor device SD 1 includes a back surface electrode BE, a semiconductor substrate SUB, an insulating layer IL, an wiring layer WL, a first nickel plated layer NiPL1, a first intermediate layer INT1, a second nickel plated layer NiPL2, a gold plated layer AuPl, and a protective film PF1.

The back surface electrode BE is, for example, a drain electrode of the semiconductor device SD 1. The back surface electrode BE is formed on the second surface SS of the semiconductor substrate SUB. Though not shown in particular, the back surface electrode BE is arranged on the wiring substrate via a solder, for example. As the back surface electrode BE, a well-known structure can be employed as a drain electrode of a so-called vertical MOSFET. The back surface electrode BE is, for example, a stacked film formed by stacking a titanium (Ti) layer, a nickel (Ni) layer, and a gold (Au) layer in this order.

The semiconductor substrate SUB is arranged on the back surface electrode BE. As described above, the semiconductor substrate SUB is formed with semiconducting element such as a vertical MOSFET. For example, the semiconductor substrate SUB is silicone substrate. For example, the thickness of the semiconductor substrate SUB is equal to or greater than 40 μm, and equal to or less than 200 μm.

The insulating layer IL is formed on the semiconductor substrate SUB so as to cover the gate electrodes GE. In the insulating layer IL, an opening is formed in the insulating layer IL to expose a region of the semiconductor substrate SUB which functions as a source region. As the insulating layer IL, a structure known as an interlayer insulating layer of a so-called vertical MOSFET can be adopted. The insulating layer IL is made of, for example, silicon oxide ($SiO_2$).

The wiring layer WL is formed on the insulating layer IL so as to fill the opening formed in the insulating layer IL. As described above, the portion of the wiring layer WL exposed from the protective film PF1 comprises the electrode pads EP1. For example, the wiring layer WL is comprised of a barrier film BM and a conductive film CF formed on the barrier film BM. An example of the material comprising the barrier film BM includes titanium tungsten (TiW), titanium nitride (TiN), titanium (Ti), and a stacked film (TiN/Ti) of titanium nitride (upper layer) and titanium (lower layer). An example of the material comprising the conductive film CF includes aluminum (Al). In order to improve the adhesion to the first nickel-plated layer NiPL1, a zinc (Zn) layer may be formed on the surface of the conductive film CF.

The first nickel-plated layer NiPL1 is formed on the electrode pad EP1. The first nickel-plated layers NiPL1 are directly or indirectly formed on the electrode pads PE1. The first nickel-plated layer NiPL1 contains phosphorus atoms at a first concentration. The phosphorus atom is an impurity derived from a reducing agent in the plating reaction.

The first concentration can be appropriately adjusted according to desired crack resistance, corrosion resistance, and the like. The first nickel plated layer NiPL1 is formed below the second nickel plated layer NiPL2, and is not directly exposed to the atmosphere in the forming process. Therefore, the first concentration is set so as to obtain higher crack resistance than corrosion resistance. From this viewpoint, the first concentration is smaller than the second concentration. For example, the first concentration is not less than 7 wt % and not more than 9 wt %.

The thickness of the first nickel-plated layer NiPL1 can be appropriately adjusted according to mechanical strength, ease of manufacturing, and the like. If the thickness of the first nickel-plated layer NiPL1 is too small, cracks tend to occur in the semiconductor device SD1. For example, the thickness of the first nickel-plated layer NiPL1 is equal to or greater than 1 μm, and preferably equal to or greater than 2 μm. On the other hand, if the thickness of the first nickel plated layer NiPL1 is too large, the semiconductor substrate SUB tends to warp at the time of manufacturing due to stresses of the first nickel plated layer NiPL1, and as a result, it tends to be difficult to appropriately transfer the semiconductor wafer SW1. For example, the thickness of the first nickel-plated layer NiPL1 is 5 μm or less, and preferably 3 μm or less.

The first intermediate layer INT1 is formed on the first nickel-plated layer NiPL1. The phosphorus concentration of the first intermediate layer INT1 continuously increases from the first nickel plated layer NiPL1 toward the second nickel plated layer NiPL2. The thickness of the first interlayer INT1 is equal to or greater than 0.1 μm, and equal to or less than 1.0 μm. Preferably, the thickness of the first interlayer INT1 is equal to or greater than 0.1 μm, and equal to or less than 0.5 μm.

The second nickel-plated layer NiPL2 is formed on the first intermediate layer INT1. In other words, the second nickel plated layer NiPL2 is formed on the first nickel plated layer NiPL1 with the first intermediate layer INT1 interposed therebetween. The second nickel-plated layer NiPL2 contains phosphorus atoms at a second concentration. The phosphorus atom is also an impurity derived from the reducing agent in the plating reaction.

The second concentration can also be appropriately adjusted according to the crack resistance, the corrosion resistance, and the like. The second nickel plated layer NiPL2 is formed on the first nickel plated layer NiPL1, and is directly exposed to the atmosphere in the process of forming the second nickel plated layer. Therefore, the second concentration is set so as to obtain a higher corrosion resistance than the crack resistance. From this viewpoint, the second concentration is larger than the first concentration. For example, the second concentration is greater than 9 wt % and less than 11 wt %.

The greater the difference between the first concentration and the second concentration, the more effectively the crack resistance due to the first nickel plated layer NiPL1 and the corrosion resistance due to the second nickel plated layer NiPL2 can be realized. For example, the difference between the first concentration and the second concentration is preferably 2 wt % or more.

The thickness of the second nickel-plated layer NiPL2 can be appropriately adjusted according to the crack resistance, the corrosion resistance, and the like. If the thickness of the second nickel-plated layer NiPL2 is too small, the effect of suppressing the corrosion caused by the plating solution tends to decrease when the gold-plated layer AuPL is formed. For example, the thickness of the second nickel-plated layer NiPL2 is preferably 0.1 μm or more. On the other hand, if the thickness of the second nickel-plated layer NiPL2 is too large, cracks tend to occur in the semiconductor device SD 1. For example, the thickness of the second nickel-plated layer NiPL2 is 0.5 μm or less, and preferably 0.2 μm or less.

An oxide layer of the first nickel plated layer NiPL1 is not formed between the first nickel plated layer NiPL1 and the second nickel plated layer NiPL2. As a result, the second nickel plated layer NiPL2 can be formed on the first nickel plated layer NiPL1 via the first intermediate layer INT1 without causing an atomic-level mismatch.

The gold plated layer AuPL is preferably formed on the second nickel plated layer NiPL2. The gold plated layer AuPL is a layer for preventing oxidization of the second nickel plated layer NiPL2 and enhancing wettability with respect to solders. The thickness of the gold plated layer AuPL is not particularly limited as long as the gold plated layer can exhibit the function. For example, the thickness of the gold plated layers AuPL is equal to or greater than 0.02 μm, and equal to or less than 0.2 μm.

The protective film PF1 is a film for protecting the semiconductor device SD1. The protective film PF1 is formed on the semiconductor substrate SUB. An opening for exposing the electrode pad EP1 to the outside is formed in the protective film PF1. The protective film PF1 is made of polyimide, for example. The thickness of the protective film PF1 is, for example, equal to or greater than 5 μm, and equal to or less than 15 μm.

The electrode pad PE1 (a part of the wiring layer WL) is exposed in the opening formed in the protective film PF1. The electrode pads PE1 are connected to external wirings such as bonding clips and bonding wires, for example. In the first embodiment, as shown in FIG. 9, the electrode pad PE1 is connected to the bonding clip BC via the solder SLD.

(Effect)

As described above, in the first embodiment, the first nickel plated layer NiPL1 is formed while moving the semiconductor wafer SW1 in the plating solution PLS at the first speed, and the second nickel plated layer NiPL2 is formed while moving the semiconductor wafer SW1 in the plating solution PLS at the second speed smaller than the first speed. As a result, in the semiconductor device SD 1, both the crack resistance due to the first nickel plated layer NiPL1 and the corrosion resistance due to the second nickel plated layer NiPL2 can be achieved. At this time, in the first embodiment, the first nickel plated layer NiPL1 and the second nickel plated layer NiPL2 are successively formed without bringing the semiconductor wafer SW1 out from the plating solution PLS. Therefore, the first nickel-plated layer NiPL1 is not exposed to the atmosphere. Thus, an oxide layer is not formed between the first nickel plated layer NiPL1 and the second nickel plated layer NiPL2. As a result, the first nickel plated layer NiPL1 and the second nickel plated layer NiPL2 can be formed without causing an atomic-level mismatch due to the presence of the oxide layer. As a result, the peeling of the second nickel plated layer NiPL2 from the first nickel plated layer NiPL1 can be suppressed, and the reliability of the semiconductor device SD 1 can be enhanced.

In first embodiment, the first nickel plated layer NiPL1 and the second nickel plated layer NiPL2 having different phosphorus concentrations can be formed by adjusting the moving speed of the semiconductor wafer SW1. That is, the first nickel plated layer NiPL1 and the second nickel plated layer NiPL2 may be formed using a common plating solution PLS and a common plating bath PLT. As a result, in the manufacturing method of the semiconductor device SD1 according to the first embodiment, it is also possible to realize simplifying of the plating device and reduce of the manufacturing costs of the semiconductor device.

Second Embodiment

The semiconductor device SD2 according to second embodiment has a three-layered nickel plated layer composed of a third nickel plated layer NiPL3, a first nickel plated layer NiPL1, and a second nickel plated layer NiPL2. Bonding clips BCs are electrically connected to the nickel-plated layers of the second embodiment.

The semiconductor device SD 2 according to second embodiment differs from the semiconductor device SD 1 according to first embodiment mainly in that it further includes a third nickel-plated layer NiPL3. Therefore, the same constituent elements as those of the semiconductor device SD 1 related to the first embodiment are denoted by the same reference numerals, and descriptions thereof are omitted.

(Method of Manufacturing Semiconductor Device)

Figure 10:
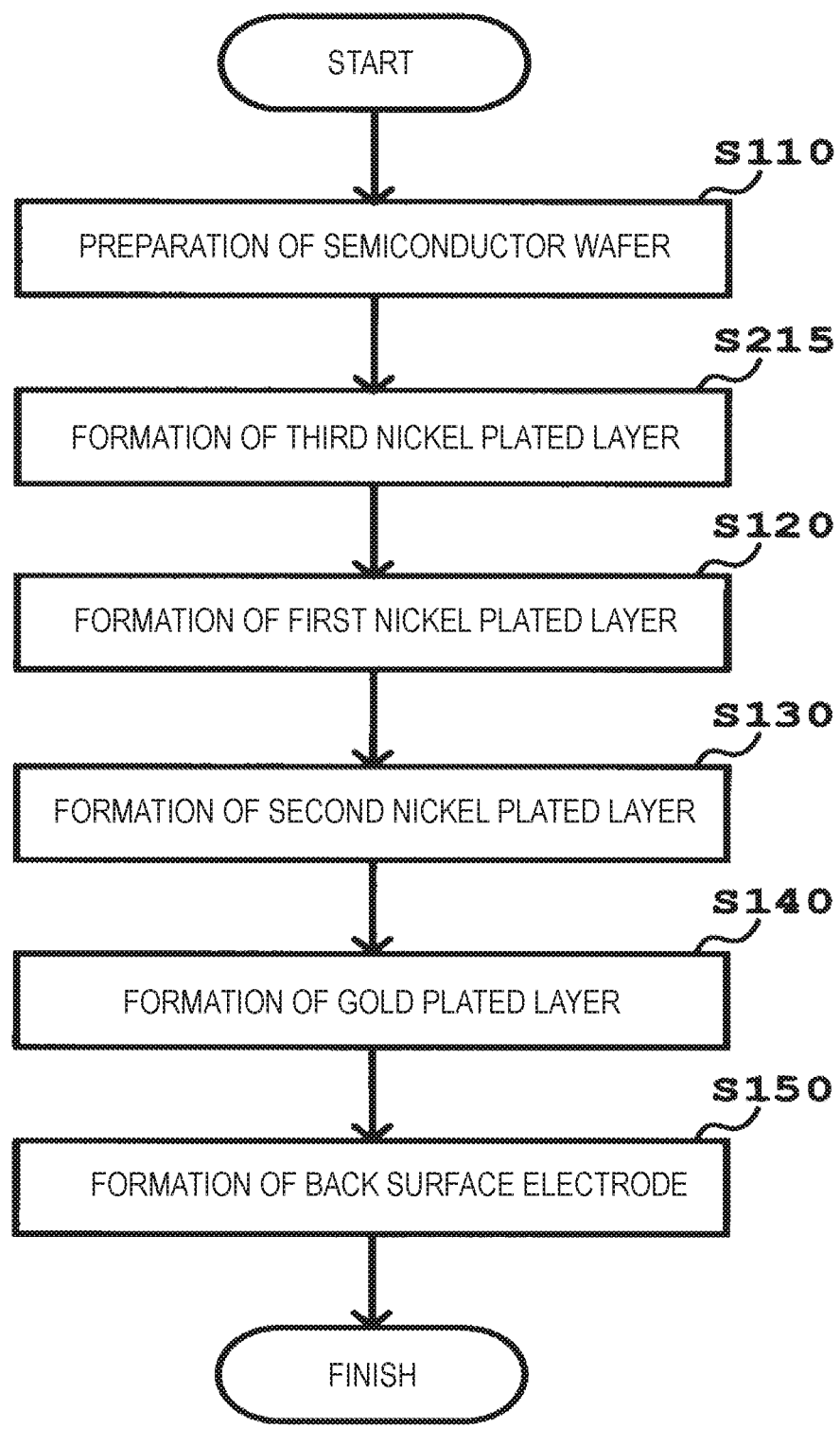
FIG. 10 is a flow chart showing an exemplary process included in the manufacturing method of the semiconductor device according to the second embodiment.

FIG. 10 is a flow chart showing an exemplary process included in the manufacturing method of the semiconductor device SD2 according to the second embodiment. FIGS. 11 to 16 are main portion cross-sectional view showing examples of the steps included in the manufacturing method of the semiconductor device SD2.

As shown in FIG. 10, the manufacturing method of the semiconductor device SD 2 includes a preparation process (S110) of the semiconductor wafer SW1, a formation process (S215) of the third nickel plated layer NiPL3, a formation process (S120) of the first nickel plated layer NiPL1, a formation process (S130) of the second nickel plated layer NiPL2, a formation process (process S140) of the gold plated layer AuPL, and a formation process (S150) of the back surface electrode BE. In second embodiment, the plating reactions are continuously performed in the forming process (S215) of the third nickel plated layer NiPL3, the forming process (S110) of the first nickel plated layer NiPL1, and the forming process (process S120) of the second nickel plated layer NiPL2 without bringing the semiconductor wafer SW1 out from the plating solution PLS.

Figure 11:
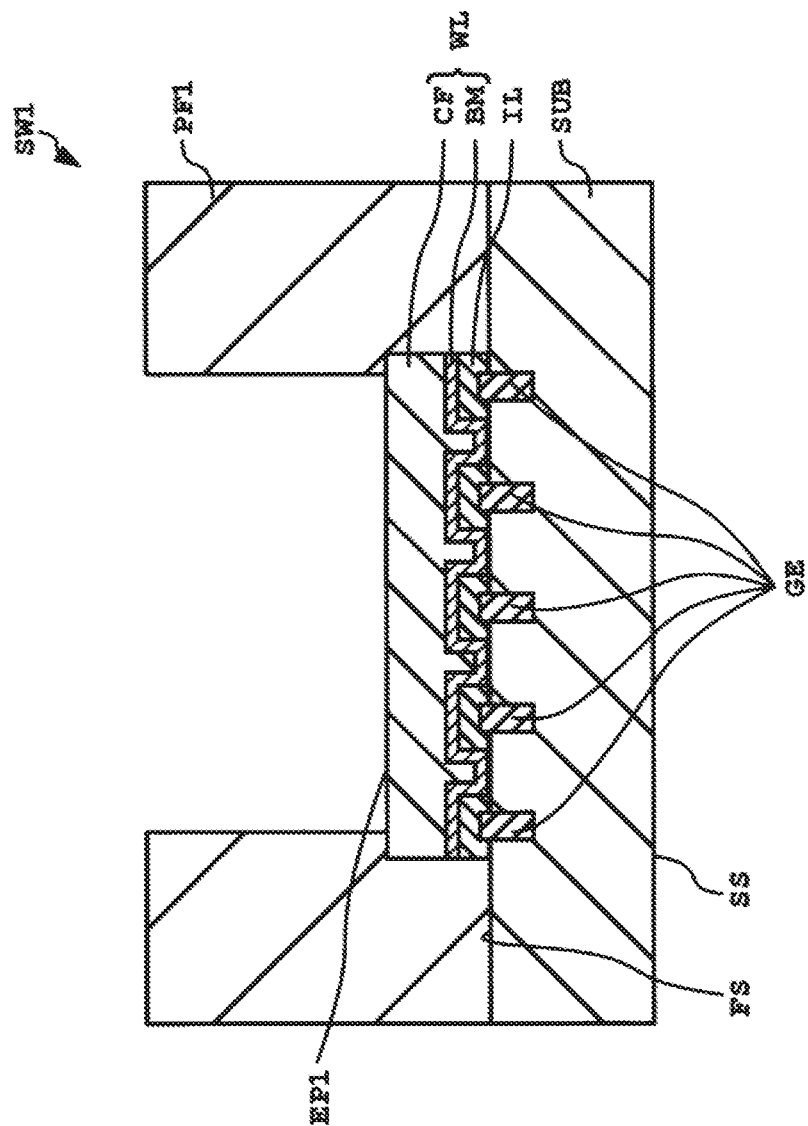
FIG. 11 is a main portion cross-sectional view showing an exemplary process included in the manufacturing method of the semiconductor device according to the second embodiment.

First, as shown in FIG. 11, a semiconductor wafer SW1 is prepared (S110).

(Step for Forming Third Nickel Plated Layer NiPL3)

Figure 12:
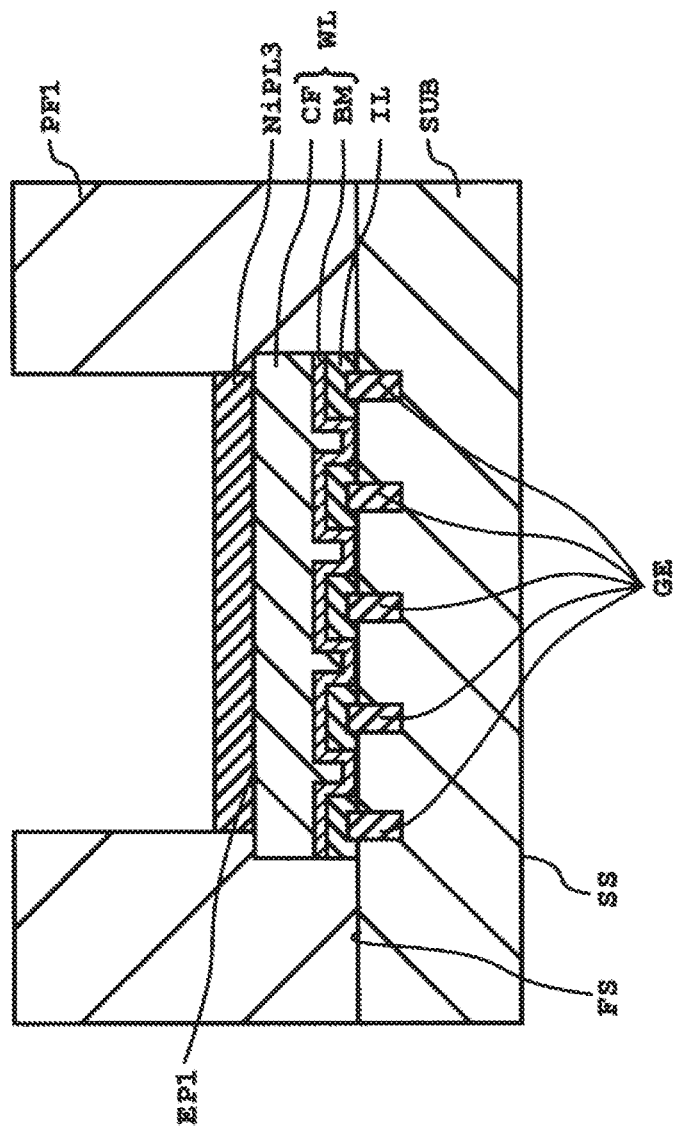
FIG. 12 is a main portion cross-sectional view showing an exemplary process included in the manufacturing method of the semiconductor device according to the second embodiment.

And then, as shown in FIG. 12, a third nickel plated layer NiPL3 is formed on the electrode pad EP1 of the semiconductor wafer SW1 (S215). The semiconductor wafer SW1 is immersed in the plating solution PLS similarly to the method of forming the first nickel-plated layer NiPL1 in first embodiment.

Next, in the plating solution PLS, the semiconductor wafer SW1 is moved at a third rate to form a third nickel-plated layer NiPL3 on the electrode pads EP1. The second embodiment also reciprocates the semiconductor wafer SW1. The moving range of the semiconductor wafer SW1 at the time of reciprocating movement of the semiconductor wafer SW1 is the same as that of first embodiment.

The third speed can be appropriately adjusted in accordance with the third concentrations of phosphorus atoms contained in the third nickel-plated-layer NiPL3. The third speed may be smaller than the first speed, and may be the same as or different from the second speed. In second embodiment, the third speed is the same as the second speed. If the third speed is too small, the circulation of the plating solution PLS on the surface of the semiconductor wafer SW1 becomes inadequate, and the plating reaction tends to not proceed properly. This may cause abnormal growth of the plated layer, resulting in abnormal appearance of the plated layer. For example, the third speed (frequency) is preferably 0.3 Hz or more. For example, when the semiconductor wafer SW1 is reciprocated, the third frequency is less than 1 Hz.

(Step for Forming First Nickel Plated Layer NiPL1)

Figure 13:
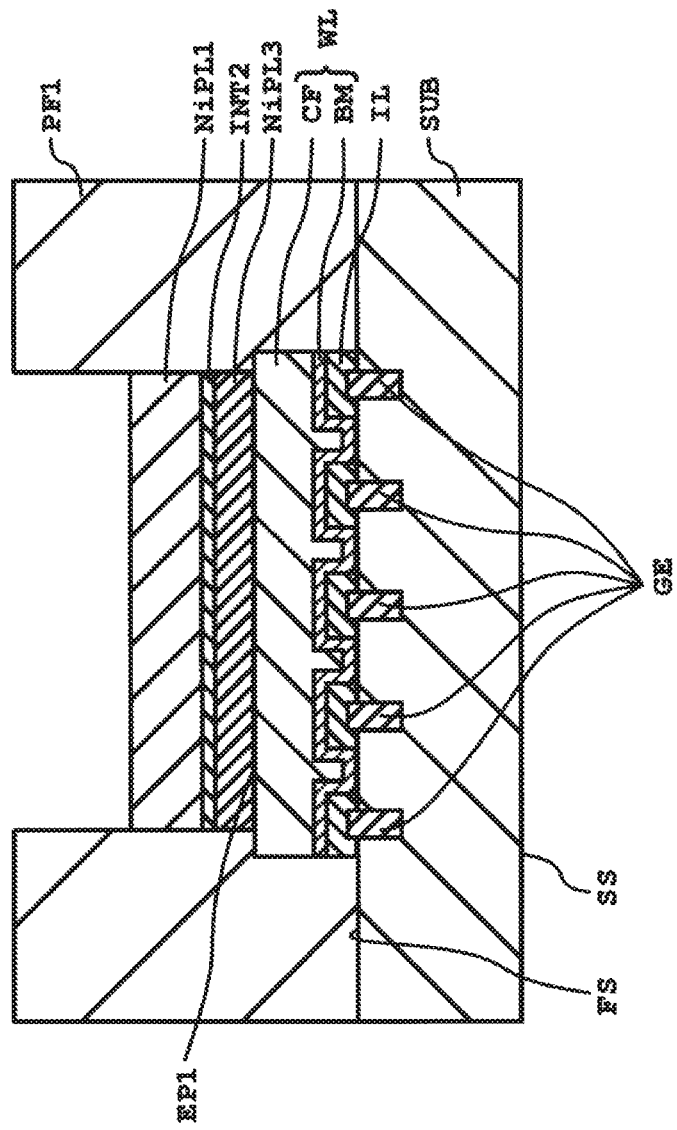
FIG. 13 is a main portion cross-sectional view showing an exemplary process included in the manufacturing method of the semiconductor device according to the second embodiment.

Next, as shown in FIG. 13, a first nickel plated layer NiPL1 is formed on the third nickel plated layer NiPL3 via the second intermediate layer INT2. Specifically, the moving speed of the semiconductor wafer SW1 in the plating solution PLS may be switched from the third speed to the first speed by adjusting the operation of the cylinder CY shown in FIG. 2. At this time, the switching from the third speed to the first speed is performed continuously without bringing the semiconductor wafer SW1 out from the plating solution. As a result, the first nickel plated layer NiPL1 can be formed on the third nickel plated layer NiPL3 without oxidizing the surfaces of the third nickel plated layer NiPL3.

Figure 14:
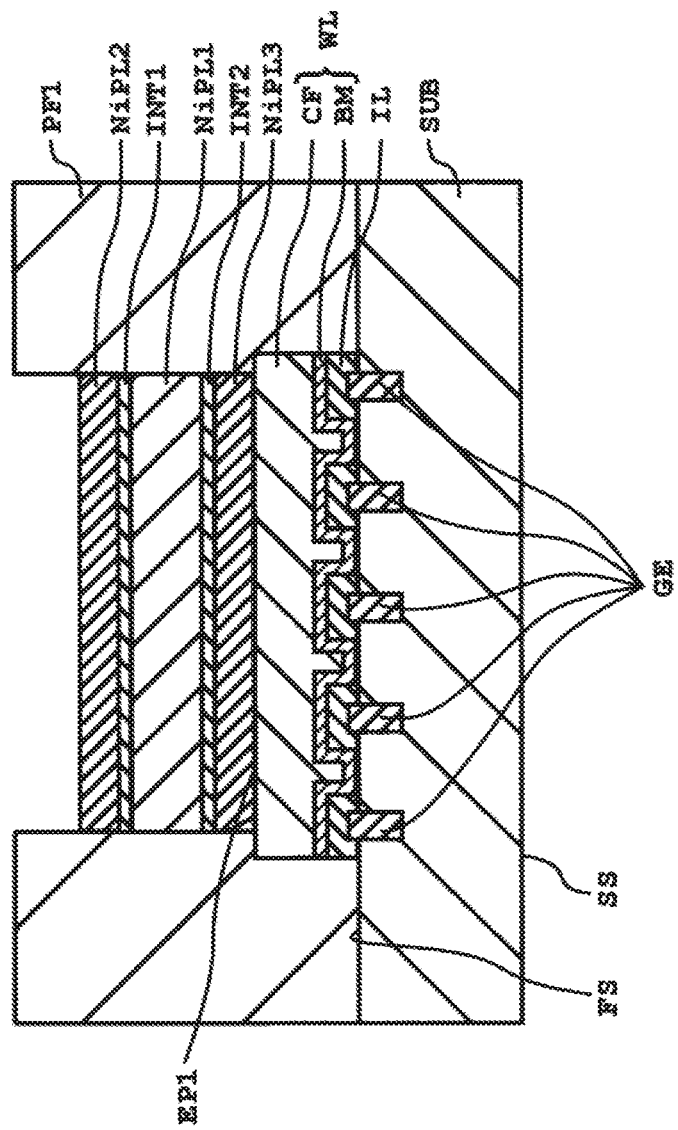
FIG. 14 is a main portion cross-sectional view showing an exemplary process included in the manufacturing method of the semiconductor device according to the second embodiment.
Figure 15:
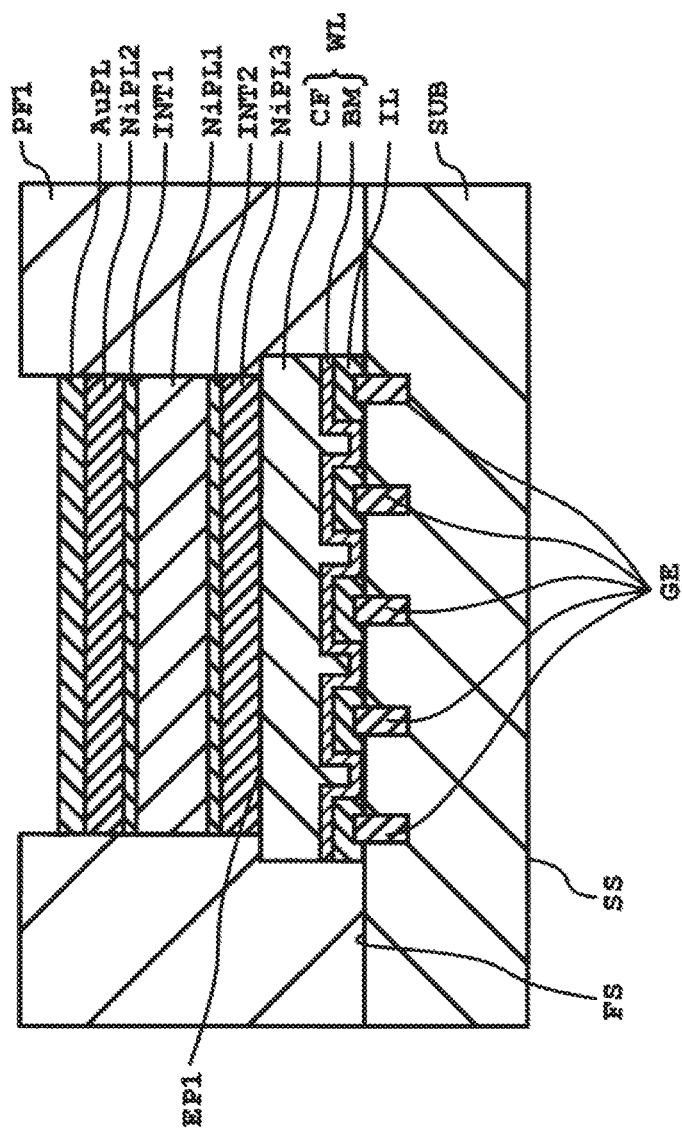
FIG. 15 is a main portion cross-sectional view showing an exemplary process included in the manufacturing method of the semiconductor device according to the second embodiment.
Figure 16:
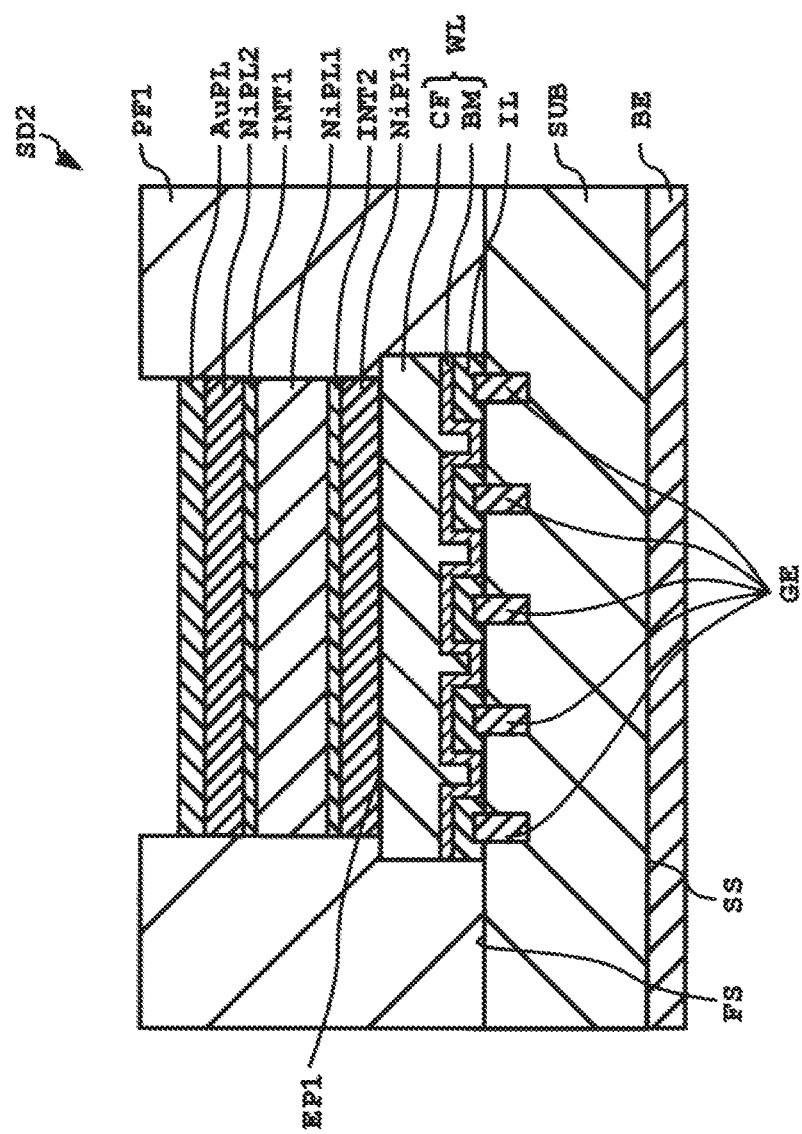
FIG. 16 is a main portion cross-sectional view showing an exemplary process included in the manufacturing method of the semiconductor device according to the second embodiment.

Next, as shown in FIG. 14, FIG. 15, and FIG. 16, the second nickel-plated layer NiPL2, the gold-plated layer AuPL, and the back surface electrode BE are formed in this order by the same procedures as those of first embodiment, and then the semiconductor wafer SW1 is diced to obtain a plurality of singulated semiconductor device SDs 2.

Since the third speed is smaller than the first speed, the phosphorus concentration (third concentration) of the third nickel plated layer NiPL3 can be made larger than the phosphorus concentration (first concentration) of the first nickel plated layer NiPL1. As a result, the adhesion of the electrode pad EP1 and the third nickel plated layer NiPL3 is higher than the adhesion of the electrode pad EP1 and the first nickel plated layer NiPL1. Thereby, in the step of forming the gold plated layer AuPL, when the plating solution for gold plating reaches the interface between the electrode pad EP1 and the third nickel plated layer NiPL3 via the interface between the protective film PF1 and the nickel plated layer, corrosion that may occur at the interface of the electrode pad AuPL and the third nickel plated layer OOE can be suppressed. Therefore, as compared with the case where the semiconductor device does not have the third nickel plated layer NiPL3, it is possible to suppress the increase in the resistivity between the electrode pad EP1 and the nickel plated layer caused by the corrosion, the peeling of the nickel plated layer from the electrode pad EP1, and to improve the reliability of the semiconductor device SD2.

In the step of forming the third nickel plated layer NiPL3 (step S215) and the step of forming the first nickel plated layer NiPL1 (step S120), plating reactions are continuously performed without bringing the semiconductor wafer SW1 out from the plating solution PLS. Thus, the process of forming the third nickel plated layer NiPL3 can be performed under substantially the same condition as the step of forming the first nickel plated layer NiPL1, except for the moving speed of the semiconductor wafer SW1.

(Configuration of Semiconductor Device)

Figure 17:
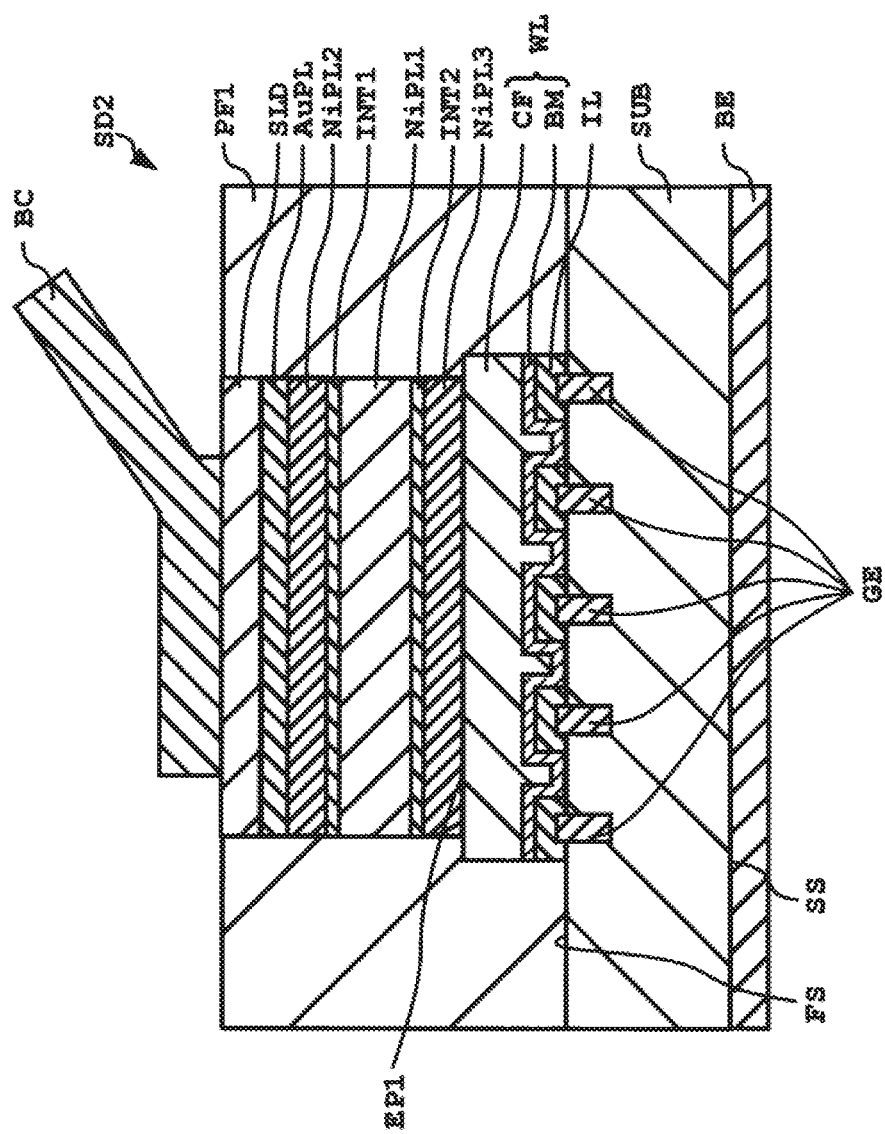
FIG. 17 is a main portion cross-sectional view showing an exemplary configuration of a semiconductor device according to the second embodiment.

Next, the configuration of the semiconductor device SD2 according to the second embodiment will be described. FIG. 17 is a main portion cross-sectional view showing an exemplary configuration of the semiconductor device SD2 according to the second embodiment.

As shown in FIG. 17, the semiconductor device SD 2 includes back surface electrode BE, semiconductor substrate SUB, an insulating layer IL, a wire layer WL, a third nickel plated layer NiPL3, a second intermediate layer INT2, a first nickel plated layer NiPL1, a first intermediate layer INT1, a second nickel plated layer NPL2, a gold plated layer AuPL, and a protective film PF1.

The third nickel plated layer NiPL3 is formed between the electrode pad EP1 and the first nickel plated layer NiPL1. The third nickel-plated layer NiPL3 is directly or indirectly formed on the electrode pad EP1. The third nickel-plated layer NiPL3 contains phosphorus atoms at a third concentration. The phosphorus atom is an impurity derived from a reducing agent in the plating reaction.

The third density can be appropriately adjusted according to the adhesiveness of the electrode pad EP1 and the third nickel-plated layer NiPL3. The third concentration may be larger than the first concentration of the first nickel plated layer NiPL1, and may be the same as or different from the second concentration of the second nickel plated layer NiPL2. In second embodiment, the third concentration is the same as the second concentration. For example, the third concentration is greater than 9 wt % and less than 11 wt %.

The greater the difference between the third concentration and the first concentration, the more effectively the corrosion resistance by the third nickel plated layer NiPL3 and the crack resistance by the first nickel plated layer NiPL1 can be realized. For example, it is preferable that the difference between the third concentration and the first concentration is 2 wt % or more.

The thickness of the third nickel-plated layer NiPL3 can be appropriately adjusted according to the crack resistance, the corrosion resistance, and the like. If the thickness of the third nickel-plated layer NiPL3 is too small, the corrosion suppressing effect (corrosion resistance) tends to be lowered when the gold-plated layer AuPL is formed. For example, the thickness of the third nickel-plated layer NiPL3 is preferably 0.1 µm or more. On the other hand, if the thickness of the third nickel plated layer NiPL3 is too large, cracks tend to occur in the NiPL3 of the third nickel plated layer. For example, the thickness of the third nickel-plated layer NiPL3 is 0.5 µm or less, and preferably 0.2 µm or less.

The second intermediate layer INT2 is formed between the third nickel plated layer NiPL3 and the first nickel plated layer NiPL1. The phosphorus concentration of the second intermediate layer INT2 continuously increases from the third nickel plated layer NiPL3 toward the first nickel plated layer NiPL1. The thickness of the second interlayer INT2 is equal to or greater than 0.1 µm, and equal to or less than 1.0 µm. Preferably, the thickness of the second interlayer INT2 is equal to or greater than 0.1 µm, or equal to or less than 0.5 µm.

(Effect)

The semiconductor device SD 2 related to second embodiment also exhibits the same effect as the semiconductor device SD 1 related to first embodiment. Further, the semiconductor device SD2 according to second embodiment has a third nickel plated layer NiPL3 having a phosphorus concentration higher than the phosphorus concentration of the first nickel plated layer NiPL1. Therefore, it is possible to suppress the increase in resistivity between the electrode pad EP1 and the third nickel plated layer NiPL3 caused by erosion and the peeling of the third nickel plated layer NiPL3 from the electrode pad EP1. As a result, the reliability of semiconductor device can be further enhanced in second embodiment compared to semiconductor device SD1 according to first embodiment.

Third Embodiment

The semiconductor device SD3 according to third embodiment has a three-layered nickel plated layer composed of a third nickel plated layer NiPL3, a first nickel plated layer NiPL1, and a second nickel plated layer NiPL2. Bond wires BWs are electrically connected to the nickel-plated layers of the third embodiment.

The semiconductor device SD 3 according to third embodiment differs from the semiconductor device SD 2 according to second embodiment mainly in the structures of the semiconductor wafer SW3 prepared in the process of preparing the semiconductor wafer. Therefore, the same reference numerals are given to the same components as the semiconductor device SD 2 according to the second embodiment and the manufacturing method thereof, and descriptions thereof are omitted.

(Method of Manufacturing Semiconductor Device)

Figure 18:
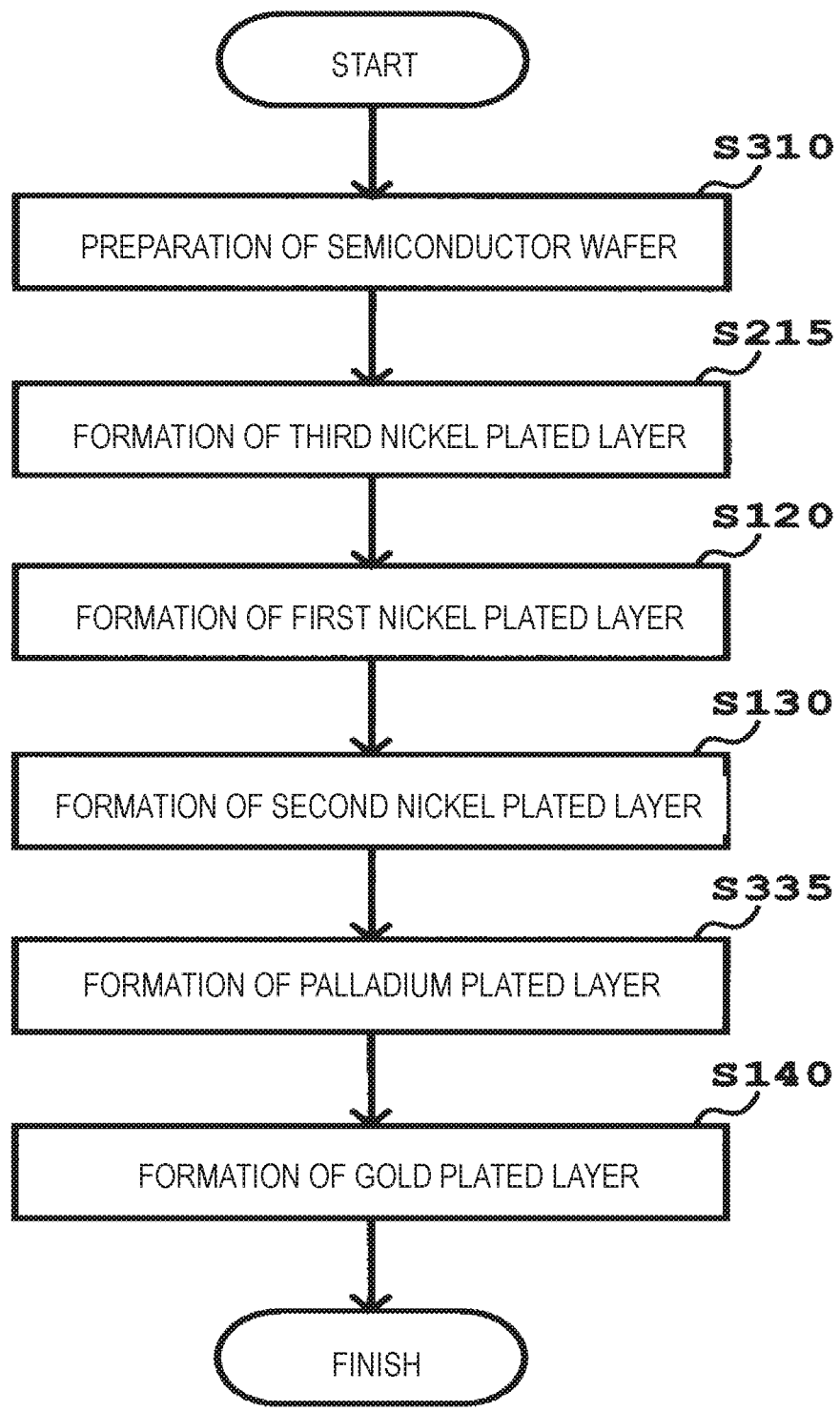
FIG. 18 is a flow chart showing an exemplary process included in the manufacturing method of the semiconductor device according to the third embodiment.

FIG. 18 is a flow chart showing an exemplary process included in the manufacturing method of the semiconductor device SD3 according to the third embodiment. FIGS. 19 to 24 are main portion cross-sectional view showing examples of the steps included in the manufacturing method of the semiconductor device SD3.

As shown in FIG. 18, the manufacturing method of the semiconductor device SD 3 includes a preparation process (S310) of the semiconductor wafer SW3, a formation process (S215) of the third nickel plated layer NiPL3, a formation process (S120) of the first nickel plated layer NiPL1, a formation process (S130) of the second nickel plated layer NiPL2, a formation process (S335) of the palladium plated layer PdPL, and a formation process (process S140) of the gold plated layer AuPL.

(Step for Preparing Semiconductor Wafer SW3)

Figure 19:
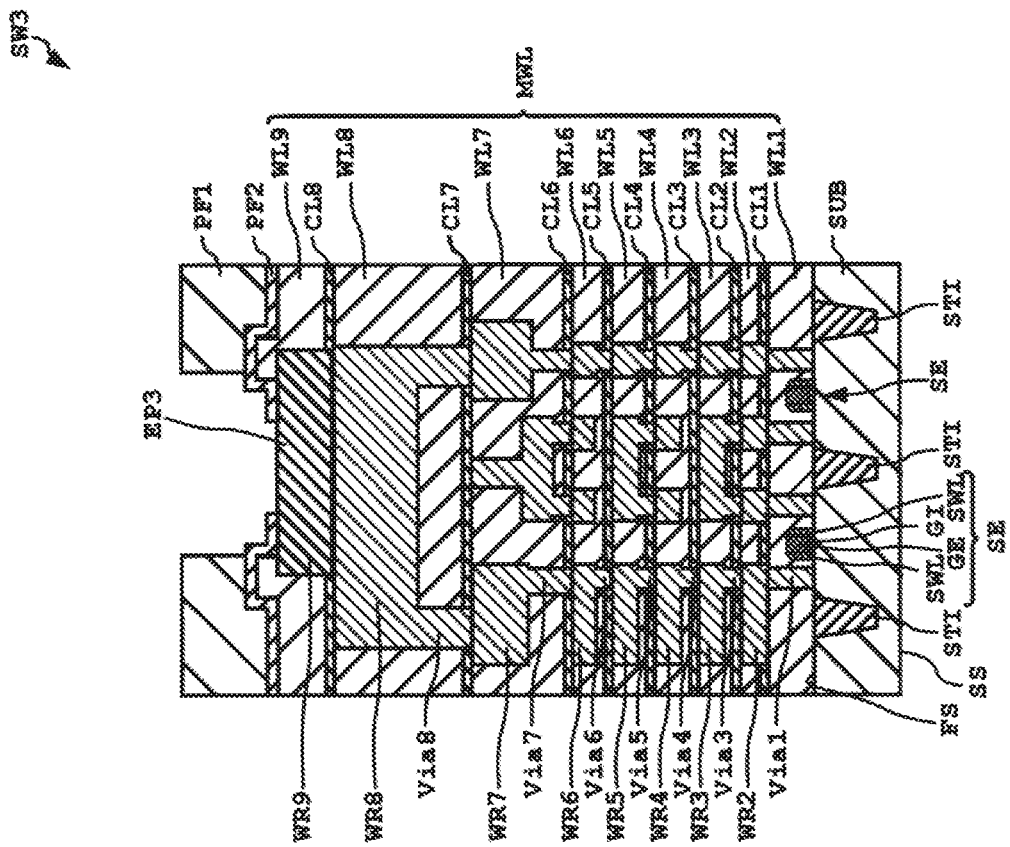
FIG. 19 is a main portion cross-sectional view showing an exemplary process included in the manufacturing method of the semiconductor device according to the third embodiment.

First, as shown in FIG. 19, a semiconductor wafer SW3 is prepared (S310). The semiconductor wafer SW3 according to the third embodiment includes a semiconductor substrate SUB, a multi-layer wiring layer MWL, and protective films PF1 and PF2. A portion of the uppermost wiring of the multilayer wiring layer MWL exposed from the protective films PF1 and PF2 comprises an electrode pad EP3. The prepared semiconductor wafer SW3 is placed on a wafer carrier WCR for the semiconductor wafer WCR.

An example of the size (diameter) of the semiconductor wafer SW3 is not particularly limited, and is the same as the example of the size (diameter) of the semiconductor wafer SW1 according to first embodiment.

The semiconductor wafer SW3 is obtained by, for example, forming the multi-layer wiring layer MWL, the protective film PF2, and the protective film PF1 on the semiconductor substrate SUB in this order.

The semiconductor substrate SUB has a first surface FS and a second surface SS that are both front and back relative to each other. In the first embodiment, a semiconductor element SE and an element isolation area STI for electrically isolating two semiconductor elements SE adjacent to each other are formed on the first surface FS of the semiconductor substrate SUB 3. The number of semiconductor elements SE and the number of element isolation regions STI are both plural.

An example of the semiconductor element SE includes a so-called planar MOSFET. Here, the planar MOSFET is a MOSFET in which channels are formed along the main surface of the semiconductor substrate SUB 3. For example, the semiconductor element SE includes a source region, a drain region, a gate insulating film GI, gate electrodes GE3, and sidewalls SWL. As a method of forming the semiconductor element SE, the semiconductor element SE can be appropriately selected from known methods for forming a planar MOSFET.

The isolation regions STI are composed of concave portions formed in the first surface FS of the semiconductor substrate SUB and a silicon oxide film buried in the recesses.

The multilayer wiring layer MWL is a layer having two or more wiring layers. The wiring layer is a layer including one or both of an insulating layer and a wiring and a via (also referred to as a "plug") formed in the same layer as the insulating layer. The via is a conductor that electrically connects a wiring and a source region (or a drain region) or two wirings formed in a layer overlapping each other.

The multilayer wiring layer MWL according to the third embodiment includes first to ninth wiring layers WL1 to WL9, and first to eighth cap insulating layers CL1 to CL8. As shown in FIG. 19, the first to ninth wiring layers WL1 to WL9 are stacked on the semiconductor substrate SUB in this order. A cap insulating layer is formed between two wiring layers adjacent to each other in the stacking direction of the multilayer wiring layer MWL. For example, a first capping insulating layer CL1 is formed between the first wiring layer WL1 and the second wiring layer WL2.

The first wiring layer WL1 is a wiring layer closest to the semiconductor substrate SUB in the multilayered wiring layer MWL. In the first wiring layer WL1, a via Via1 for connecting a source region (or a drain region) and a wiring WR2 formed in the second wiring layer WL2 and the gate electrode GE are formed.

One or both of the wiring and the via are formed in each of the second wiring layer WL2 to the eighth wiring layer WL8. A wiring WR2 is formed on the second wiring layers WL2. As shown in FIG. 19, vias Via3~Via8 and wiring WR3~WR8 are formed in the third wiring layer WL3 to the eighth wiring layer WL8.

The ninth wiring layer WL9 is the wiring layer farthest from the semiconductor substrate SUB in the multilayer wiring layer MWL. A wiring WR9 is formed in the ninth wiring layer WL9. A portion of the wiring WR9 exposed from the protective films PF1 and PF2 comprises the electrode pad EP3.

The thickness of each wiring layer comprising the multilayer wiring layer MWL may be the same or different from each other. An example of the material of each of the wiring and the via comprising each wiring layer includes copper and aluminum. An example of the insulating layer comprising the respective wiring layer includes silicon oxide (SiO2), fluorine-containing silicon oxide (SiOF), and carbon-containing silicon oxide (SiOC or SiOCH). An example of the material comprising each of the first to eighth cap insulating layers CL1 to CIL8 includes silicon nitride (SiN), silicon carbide (SiC), and carbon-containing silicon nitride (SiCN).

Next, protective films PF1 and PF2 having openings exposing a portion of the wiring WR9 are formed on the ninth wiring layer WL9. First, after the protective film PF2 is formed, an opening for exposing a part of the wiring WR9 is formed in the protective film PF2. Next, after a protective film PF1 is formed on the protective film PF2, an opening for exposing the wiring WR9 exposed from the protective film PF2 is formed in the protective film PF1. An example of the method for forming the protective films PF1 and PF2 includes a sputtering method. Openings in the protective films PF1 and PF2 can be formed by removing portions of the protective films PF1 and PF2 by photolithography and etch techniques.

An example of a material comprising the protective film PF2 includes silicon oxide (SiO2), silicon nitride (SiN), and silicon oxynitride (SiON).

The size of the opening formed in the protective film PF1 may be the same as or different from the size of the opening formed in the protective film PF2. In third embodiment, the size of the opening formed in the protective film PF1 is larger than the size of the opening formed in the protective film PF2.

Figure 20:
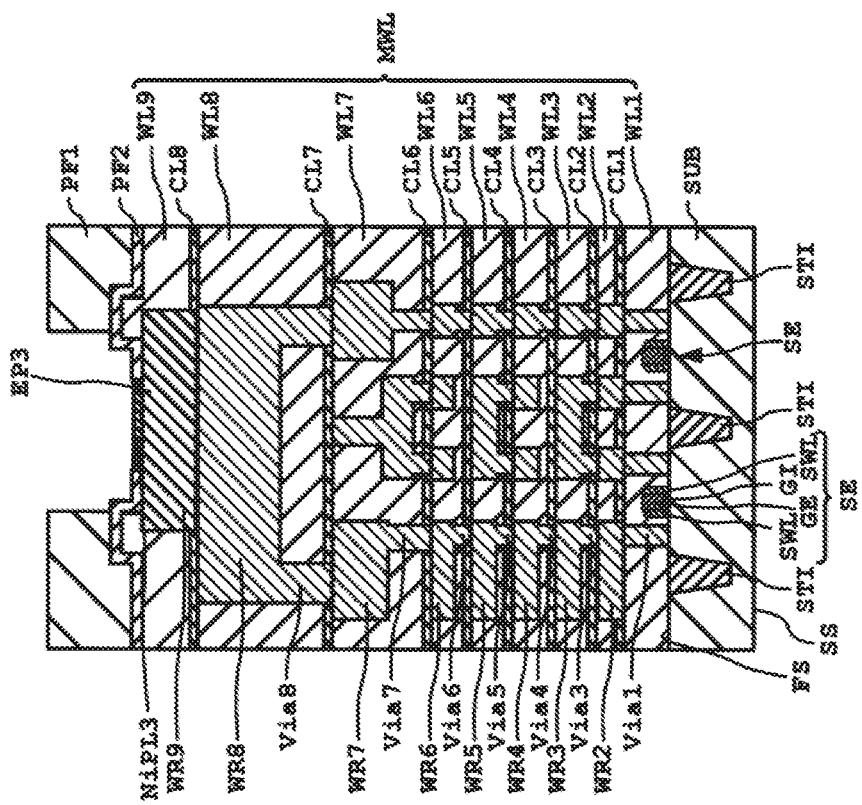
FIG. 20 is a main portion cross-sectional view showing an exemplary process included in the manufacturing method of the semiconductor device according to the third embodiment.
Figure 21:
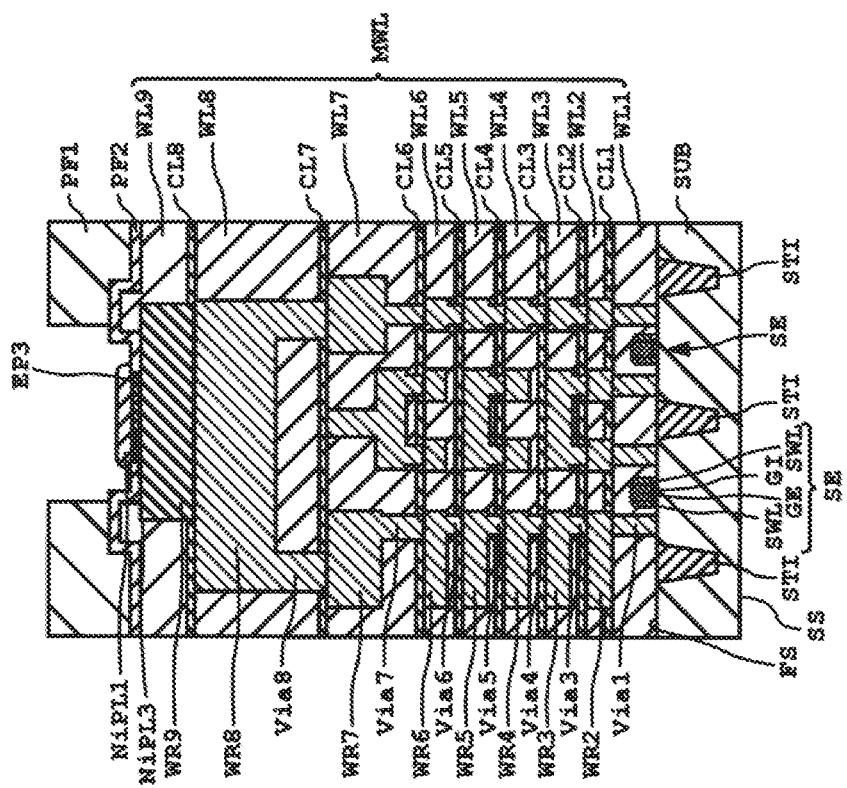
FIG. 21 is a main portion cross-sectional view showing an exemplary process included in the manufacturing method of the semiconductor device according to the third embodiment.
Figure 22:
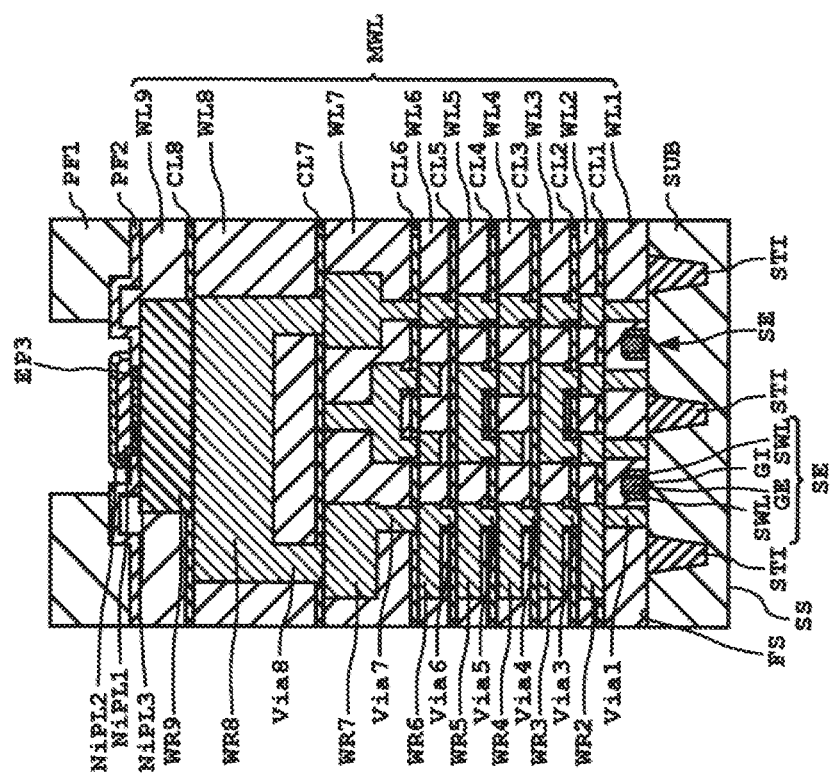
FIG. 22 is a main portion cross-sectional view showing an exemplary process included in the manufacturing method of the semiconductor device according to the third embodiment.

Next, as shown in FIGS. 20, 21, and 22, a third nickel plated layer NiPL3, a first nickel plated layer NiPL1, and a second nickel plated layer NiPL2 are formed on the electrode pad EP3 in this order in the same manner as in second embodiment.

(Step for Forming Palladium Plated Layer)

Figure 23:
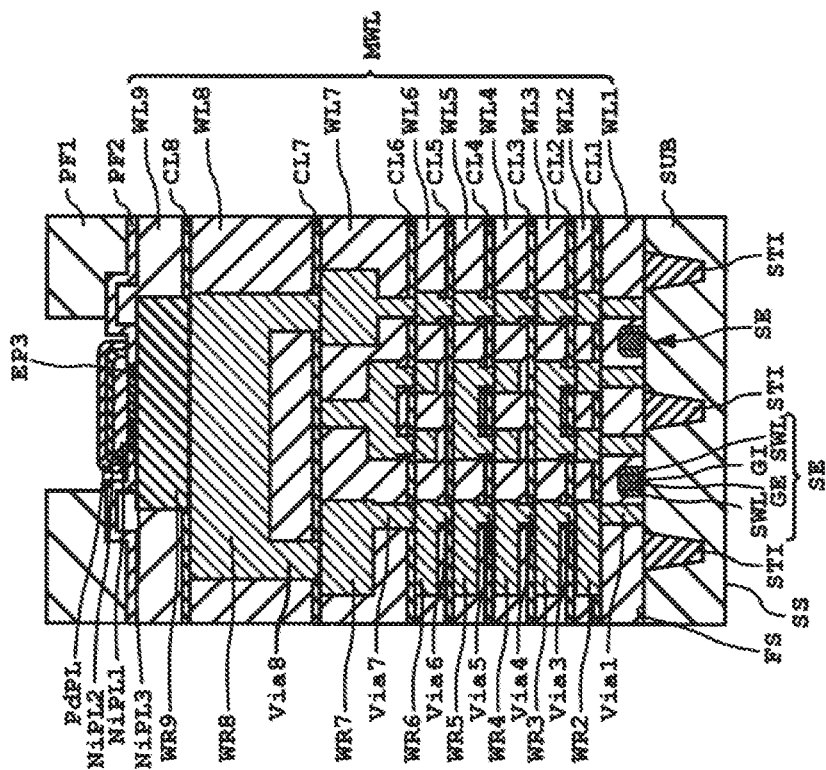
FIG. 23 is a main portion cross-sectional view showing an exemplary process included in the manufacturing method of the semiconductor device according to the third embodiment.

Next, as shown in FIG. 23, it is preferable to form a palladium plated layer PdPL on the second nickel plated layer NiPL2 (S335). Specifically, first, a plating solution for palladium plating is prepared. The component contained in the plating solution can be appropriately selected from materials known as a plating solution for palladium plating. The plating solution is, for example, an aqueous solution containing a palladium compound such as palladium chloride, palladium sulfate, or palladium acetate. The plating solution is accommodated in a plating bath in a plating device for electroless plating.

Next, the palladium-plated layer PdPL may be formed on the second nickel-plated layer NiPL2 in the same manner as the first nickel-plated layer NiPL1 except that the plating solution differs. In the step of forming the palladium-plated layer PdPL, the semiconductor wafer SW1 may or may not be moved. If required, after the palladium-plated layers PdPL are formed, the SW3 of the semiconductor wafer may be cleaned with pure water.

Figure 24:
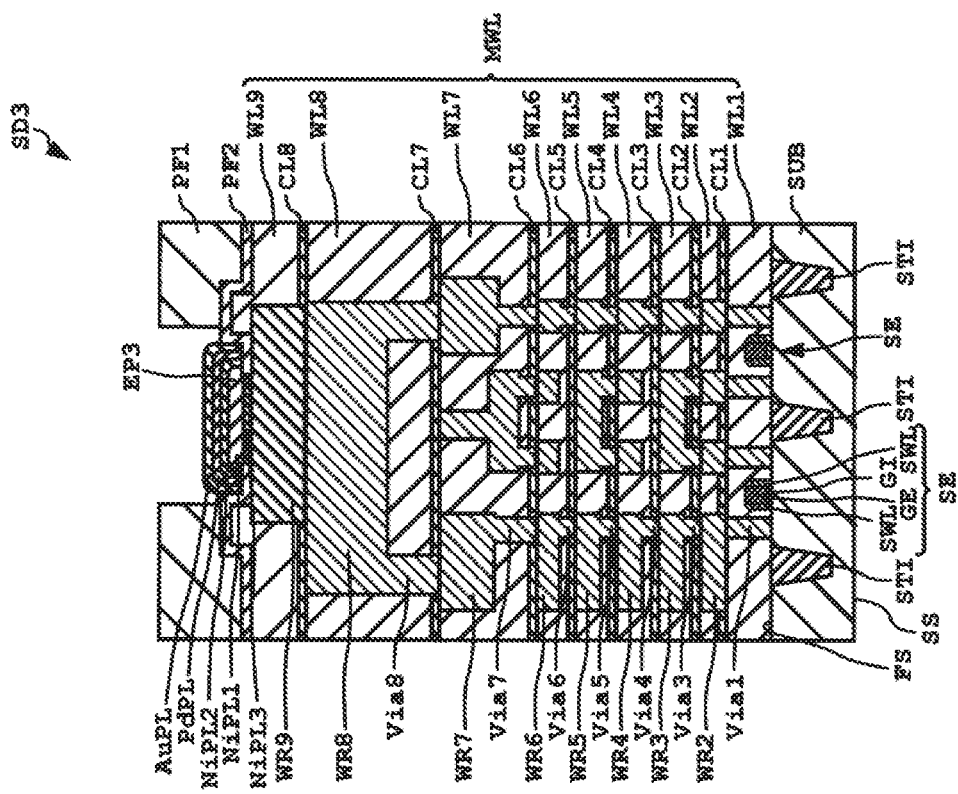
FIG. 24 is a main portion cross-sectional view showing an exemplary process included in the manufacturing method of the semiconductor device according to the third embodiment.

Next, as shown in FIG. 24, a gold plated layer AuPL is formed on the palladium-plated layer PdPL by the same procedures as in first embodiment, thereby forming the semiconductor device SD 3 according to third embodiment. Finally, by dicing the semiconductor wafer SW3, a plurality of singulated semiconductor device SDs 3 are obtained.

(Configuration of Semiconductor Device)

Figure 25:
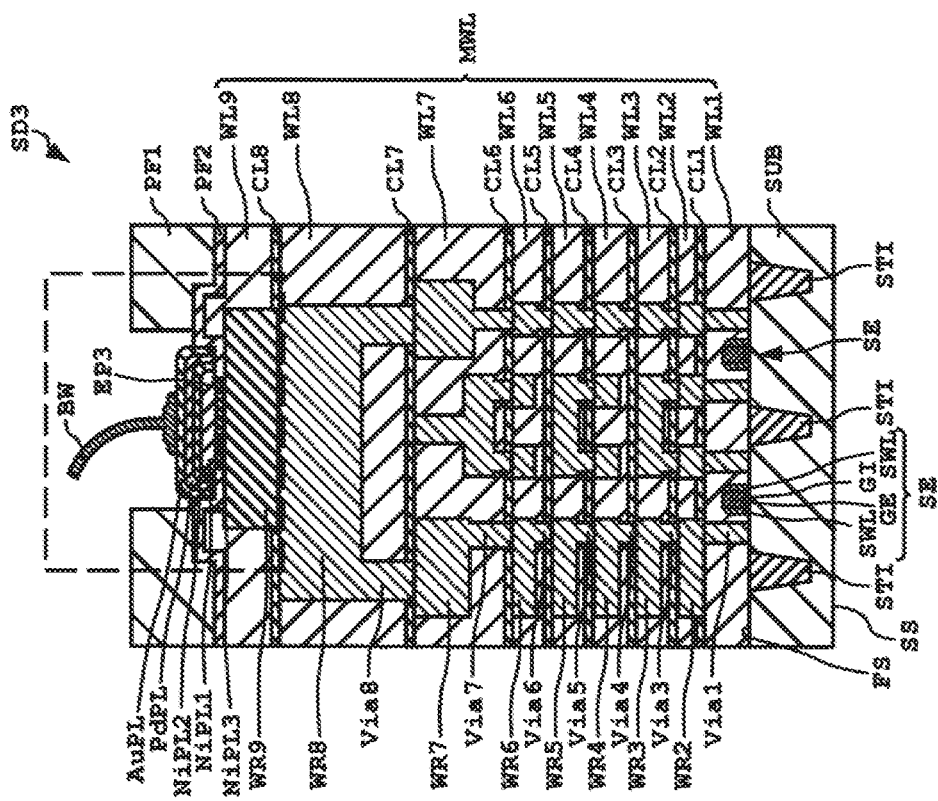
FIG. 25 is a main portion cross-sectional view showing an exemplary configuration of a semiconductor device according to the third embodiment.

Next, the configuration of the semiconductor device SD3 according to the third embodiment will be described. FIG. 25 is a main portion cross-sectional view showing an exemplary configuration of the semiconductor device SD 3, and FIG. 26 is a partial enlarged cross-sectional view of an area indicated by a broken line in FIG. 25.

Figure 26:
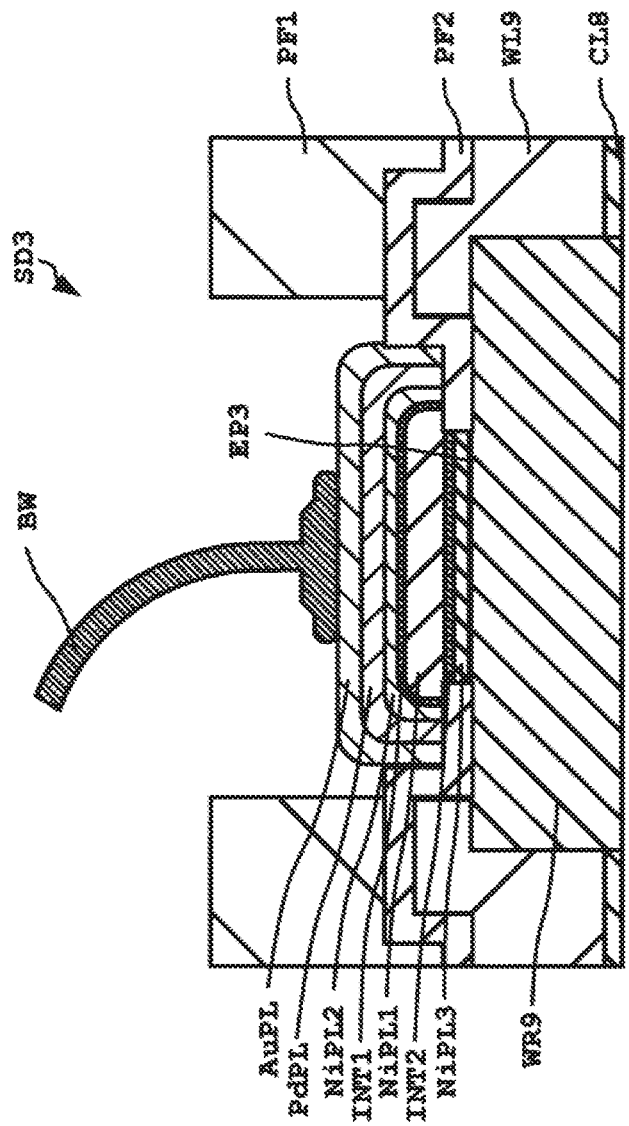
FIG. 26 is a main portion cross-sectional view showing an exemplary configuration of a semiconductor device according to the third embodiment.

As shown in FIGS. 25 and 26, the semiconductor device SD 3 includes a semiconductor substrate SUB, a multilayer wiring layer MWL, a protective film PF2, a protective film PF1, a third nickel plated layer NiPL3, a second intermediate layer INT2, a first nickel plated layer NiPL1, a first intermediate layer INT1, a second nickel plated layer NPL2, a palladium plated layer PdPL, and a gold plated layer AuPL.

The protective film PF2 is a film for protecting the semiconductor device SD3. An opening is formed in the protective film PF2 to expose the uppermost wiring (ninth wiring WR9) of the multi-layer wiring layer MWL to the outside of the multi-layer wiring layer MWL. An example of the material for the protective film PF2 includes silicon oxynitride (SiON), silicon oxide (SiO2), and silicon nitride (SiN). The size of the opening formed in the protective film PF2 is not particularly limited and may be large enough for bonding. The thickness of the protective film PF2 is, for example, equal to or greater than 0.7 μm, and equal to or less than 1.0 μm.

The protective film PF1 is also a film for protecting the semiconductor device SD3. An opening is formed in the protective film PF1 to expose the electrode pad PE to the outside of the electrode pad PE. The size of the opening formed in the protective film PF1 may be the same as or different from the size of the opening formed in the protective film PF2. In third embodiment, the size of the opening formed in the protective film PF1 is larger than the size of the opening formed in the protective film PF2.

The palladium-plated layer PdPL is preferably formed on the second nickel-plated layer NiPL2. The palladium-plated layer PdPL suppresses nickel atoms contained in the second nickel-plated layer NiPL2 from diffusing into the gold-plated layer AuPL. As a result, it is possible to suppress bonding defects of the bonding wires BW caused by nickel atoms present on the gold plated layers AuPL. The thickness of the palladium-plated layer PdPL is not particularly limited as long as the palladium-plated layer can exhibit the above function. The thickness of the palladium-plated layer PdPL is, for example, equal to or greater than 0.02 µm, and equal to or less than 0.5 µm. In third embodiment, the gold plated layer AuPL is formed on the palladium plated layer PdPL.
(Effect)

The semiconductor device SD 3 related to third embodiment also exhibits the same effect as the semiconductor device SD 2 related to second embodiment. Further, since the semiconductor device SD3 according to third embodiment has a palladium-plated layer PdPL, the adhesion between the gold-plated layer AuPL and the bonding wire BW can be enhanced, and the reliability of the semiconductor device can be further enhanced.

It should be noted that the present invention is not limited to the above-mentioned embodiments, and various modifications can be made without departing from the gist thereof. For example, although a mode in which a phosphorus compound containing phosphorus atoms is used as the reducing agent of the plating solution PLS has been described in the above embodiment, the plating solution PLS may contain a boron compound containing boron atoms as the reducing agent. An example of the reducing agent containing a boron atom includes sodium borohydride, dimethylamine borane and diethylamine borane.

Further, in the first through third embodiments, a mode in which the semiconductor wafers SW1 and SW3 are moved at the second speed in the forming process of the second nickel plated layer NiPL2 has been described, and in second and third embodiments, a mode in which the semiconductor wafers SW1 and SW3 are moved at the third speed in the forming process of the third nickel plated layer NiPL3 has been described. However, the semiconductor wafer SW1 and the semiconductor wafer SW3 may not be moved in the process of forming the second nickel plated layer NiPL2 and the step of forming the third nickel plated layer NiPL3. In this case, the moving rate of the semiconductor wafer SW1 is 0 Hz.

In the first through third embodiments, the semiconductor wafers SW1 and SW3 are reciprocally moved, but the system of moving the semiconductor wafers is not limited to this. For example, the semiconductor wafer may be reciprocated and rotated. However, when the semiconductor wafer is rotationally moved, since the moving speed at the center portion of the semiconductor wafer and the moving speed at the outer edge portion of the semiconductor wafer are different from each other, it is preferable that the semiconductor wafer is reciprocally moved without being rotationally moved from the viewpoint of uniformly forming the nickel plated layer in the semiconductor wafer.

In the first through third embodiments, the back surface electrode BE is formed after the electrode pads EP1 and EP3 are plated; however, the manufacturing method of the semiconductor device according to the embodiment of the present invention is not limited to this. For example, after the semiconductor wafer SW is prepared and the back surface electrode BE are formed, the electrode pads may be plated. In this case, from the viewpoint of protecting the back surface electrode BE, the plating process is performed in a state where the back surface electrode BE is covered with the protective sheet.

In addition, even when a specific numerical value example is described, it may be a numerical value exceeding the specific numerical value, or may be a numerical value less than the specific numerical value, except when it is theoretically obviously limited to the numerical value. In addition, the component means "B containing A as a main component" or the like, and the mode containing other components is not excluded.

Further, the semiconductor device according to the first through third embodiments can be applied to, for example, microcomputers and LSIs such as S System on Chip (System on Chip).

What is claimed is:

1. A method of manufacturing a semiconductor device including a step for forming a plated layer on an electrode pad by an electroless plating method, comprising the steps of:
   preparing a semiconductor wafer having a semiconductor substrate, an insulating layer formed on the semiconductor substrate, and the electrode pad formed on the insulating layer; and
   forming the plated layer on the electrode pad by moving the semiconductor wafer at a second speed, in a nickel-plating solution, after moving the semiconductor wafer at a first speed higher than the second speed,
   wherein after moving the semiconductor wafer at the first speed, the semiconductor wafer is moved at the second speed without bringing the semiconductor wafer out from the nickel-plating solution.

2. The method according to claim 1, wherein the semiconductor wafer is moved along a main surface of the semiconductor wafer and also moved so as to make a round trip.

3. The method according to claim 2, wherein a moving range of the semiconductor wafer when the semiconductor wafer is moved so as to make the round trip is equal to or greater than 2 cm, and equal to or less than 4 cm.

4. The method according to claim 3,
   wherein the first speed is equal to or greater than 1 Hz, and equal to or less than 2 Hz, and
   wherein the second speed is equal to or greater than 0 Hz, and equal to or less than 1 Hz.

5. The method according to claim 4, wherein the second speed is equal to or greater than 0.3 Hz, and equal to or less than 1 Hz.

6. The method according to claim 1,
   wherein the plated layer is comprised of:
     a first plated layer formed with the first speed,
     a second plated layer formed with the second speed and formed over the first plated layer, and
     a first intermediate layer formed between the first plated layer and the second plated layer, and
   wherein a concentration of an atom included in the first intermediate layer is gradually increased from the first plated layer toward the second plated layer, the atom included in the first intermediate layer being one of phosphorus atom and boron atom.

7. The method according to claim 1,
   wherein the plated layer is comprised of:
     a first plated layer formed with the first speed, a second plated layer formed with the second speed and formed over the first plated layer, and a first intermediate layer formed between the first plated layer and the second plated layer, and wherein a first concentration of an atom included in the first plated layer is lower than a second concentration of an atom included in the second plated layer, the atom included in the first plated layer being one of phosphorus atom and boron atom, and the atom included in the second plated layer being one of phosphorus atom and boron atom.

8. The method according to claim 7, wherein the first concentration is equal to or greater than 7 weight percent, and equal to or less than 9 weight percent, and wherein the second concentration is greater than 9 weight percent, and equal to or less than 11 weight percent.

9. The method according to claim 7, wherein a difference between the first concentration and the second concentration is equal to or greater than 2 weight percent.

10. The method according to claim 1, wherein the plated layer is comprised of:

a first plated layer formed with the first speed, a second plated layer formed with the second speed and formed over the first plated layer, and a first intermediate layer formed between the first plated layer and the second plated layer, and wherein before forming the first plated layer, a third plated layer is formed on the electrode pad by moving the semiconductor wafer at a third speed lower than the first speed, in the nickel-plating solution, and wherein after moving the semiconductor wafer at the third speed, the semiconductor wafer is moved at the first speed without bringing the semiconductor wafer out from the plating solution.

11. The method according to claim 1, wherein the nickel-plating solution includes nickel salts and a reducing agent, and wherein the reducing agent is one of hypophosphorous acid and hypophosphite.

12. The method according to claim 1, wherein the nickel-plating solution includes nickel salts and a reducing agent, and wherein the reducing agent is one of sodium boron hydride, dimethylamine-borane and diethylamine-borane.

\* \* \* \* \*